(12) United States Patent
Jeong et al.

(10) Patent No.: US 11,758,776 B2
(45) Date of Patent: Sep. 12, 2023

(54) DISPLAY PANEL AND METHOD OF FABRICATING THE SAME

(71) Applicant: LG DISPLAY CO., LTD., Seoul (KR)

(72) Inventors: Duk Young Jeong, Paju-si (KR); Chui Nam, Paju-si (KR); Byeong Seong So, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 65 days.

(21) Appl. No.: 17/364,286

(22) Filed: Jun. 30, 2021

(65) Prior Publication Data
US 2022/0005906 A1    Jan. 6, 2022

(30) Foreign Application Priority Data

Jul. 2, 2020   (KR) ................. 10-2020-0081557
Jul. 10, 2020  (KR) ................. 10-2020-0085531

(51) Int. Cl.
| | | |
|---|---|---|
| H01L 27/32 | (2006.01) | |
| H10K 59/126 | (2023.01) | |
| H10K 71/00 | (2023.01) | |
| H10K 59/12 | (2023.01) | |

(52) U.S. Cl.
CPC .......... *H10K 59/126* (2023.02); *H10K 71/00* (2023.02); *H10K 59/1201* (2023.02)

(58) Field of Classification Search
CPC ........... H01L 27/3272; H01L 2227/323; H01L 51/56
USPC .......................................................... 257/40
See application file for complete search history.

(56) References Cited

U.S. PATENT DOCUMENTS

| | | | |
|---|---|---|---|
| 2007/0287232 A1 | 12/2007 | Lim et al. | |
| 2010/0155578 A1* | 6/2010 | Matsumoto | H01L 27/14632 250/216 |
| 2011/0204369 A1* | 8/2011 | Ha | H01L 27/3276 257/59 |
| 2012/0267611 A1 | 10/2012 | Chung | |
| 2015/0021589 A1* | 1/2015 | Chung | H01L 27/3227 257/40 |
| 2015/0206931 A1* | 7/2015 | Choi | H01L 27/3272 438/23 |
| 2016/0172633 A1* | 6/2016 | Ahn | H01L 27/3272 257/40 |
| 2017/0294425 A1* | 10/2017 | Kim | H01L 51/5253 |
| 2017/0338252 A1* | 11/2017 | Lee | H01L 27/1251 |
| 2020/0066809 A1 | 2/2020 | Liu | |
| 2020/0075680 A1 | 3/2020 | Sun et al. | |

(Continued)

FOREIGN PATENT DOCUMENTS

| | | |
|---|---|---|
| CN | 110632802 A | 12/2019 |
| CN | 110764362 A | 2/2020 |

(Continued)

*Primary Examiner* — Dzung Tran
(74) *Attorney, Agent, or Firm* — Birch. Stewart, Kolasch & Birch, LLP

(57) ABSTRACT

Provided are a display panel and a method of fabricating the same. The display panel includes a display region including a first pixel region where a plurality of pixels are disposed, a sensing region including a second pixel region where a plurality of pixel groups are disposed, and a light transmitting part disposed between the pixel groups. At least the second pixel region includes a light shield layer, and the light shield layer includes an opening hole corresponding to the light transmitting part.

21 Claims, 25 Drawing Sheets

(56) References Cited

U.S. PATENT DOCUMENTS

2020/0104562 A1* 4/2020 Sung ................. H01L 31/12
2021/0141304 A1   5/2021 Lin et al.

FOREIGN PATENT DOCUMENTS

| EP | 3 032 585 A1 | 6/2016 |
|----|--------------|--------|
| KR | 10-0785019 B1 | 12/2007 |
| KR | 10-2011-0071898 A | 6/2011 |
| KR | 10-1055779 B1 | 8/2011 |
| KR | 10-1227137 B1 | 1/2013 |
| KR | 10-2019-0003078 A | 1/2019 |

* cited by examiner

DISPLAY PANEL AND METHOD OF FABRICATING THE SAME

CROSS-REFERENCE TO RELATED APPLICATIONS

This application claims priority to and the benefit of Korean Patent Application Nos. 10-2020-0081557, filed on Jul. 2, 2020, and 10-2020-0085531, filed on Jul. 10, 2020, the entire contents of which are hereby expressly incorporated by reference into the present application.

BACKGROUND OF THE INVENTION

1. Field of the Invention

The present disclosure relates to a display panel including a sensing region where pixels on which an image is reproduced are disposed, and a method of fabricating the display panel.

2. Discussion of Related Art

An electroluminescent display device is roughly classified into an inorganic light emitting display device and an organic light emitting display device according to a material of a light emitting layer. An active-matrix type organic light emitting display device includes an organic light emitting diode (hereinafter referred to as "OLED") which emits light by itself, and has an advantage in that a response time is fast, light emitting efficiency and luminance are high, and a viewing angle is wide. In the organic light emitting display device, OLED is formed on each of the pixels. Since the organic light emitting display device not only has a fast response time, excellent luminous efficiency, luminance, and viewing angle, but also can express black gradation in full black, a contrast ratio and a color gamut are excellent.

The multimedia functions of mobile terminals are improving. For example, a camera is built into a smart phone by default, and the resolution of the camera is increasing to or higher than a level of a conventional digital camera. However, a front camera of the smart phone can restrict a screen design, which can make it difficult to design a screen. In order to reduce a space occupied by the camera, a screen configuration including a notch or punch hole has been adopted in a screen of the smart phone, but since the size of the screen is still limited due to the camera, a full-screen display may not be implemented well in such case.

SUMMARY OF THE INVENTION

In order to implement a full-screen display, a method of providing an image capturing region where low-resolution pixels are disposed in a screen of a display panel and disposing a camera at a position under the display panel opposite to the image capturing region has been proposed. The image capturing region in the screen operates as a transparent display which displays an image. In this image capturing region, there can be a limitation in that transmittance is lowered and luminance is low due to the pixels.

The present disclosure is directed to solving or address all the above-described issues and other limitations associated with the related art.

The present disclosure is directed to providing a display panel capable of improving the transmittance of a sensing region in the screen and a method of fabricating the same.

It should be noted that objects of the present disclosure are not limited to the above-described objects, and other objects of the present disclosure will be apparent to those skilled in the art from the following descriptions.

According to an aspect of the present disclosure, there is provided a display panel which includes a display region including a first pixel region where a plurality of pixels are disposed; and a sensing region including a second pixel region where a plurality of pixel groups are disposed, and a light transmitting part disposed between the pixel groups, wherein at least the sensing region includes a light shield layer, and the light shield layer includes an opening hole corresponding to the light transmitting part.

According to another aspect of the present disclosure, there is provided a method of fabricating a display panel including a display region including a first pixel region where a plurality of pixels are disposed, and a sensing region including a second pixel region where a plurality of pixel groups are disposed, and a light transmitting part disposed between the pixel groups, where the method includes forming a light shield layer at least in the sensing region, wherein the light shield layer includes an opening hole corresponding to the light transmitting part and is configured to expose the light transmitting part to a laser beam through the opening hole; forming a metal layer having a higher absorption coefficient than the light shield layer for a specific wavelength of the laser beam in the first pixel region of the display region and the sensing region; and irradiating the laser beam to at least the sensing region to remove the metal layer from the light transmitting part.

BRIEF DESCRIPTION OF THE DRAWINGS

The above and other objects, features and advantages of the present disclosure will become more apparent to those of ordinary skill in the art by describing in detail exemplary embodiments thereof with reference to the accompanying drawings, in which.

DETAILED DESCRIPTION OF THE EMBODIMENTS

Figure 1:
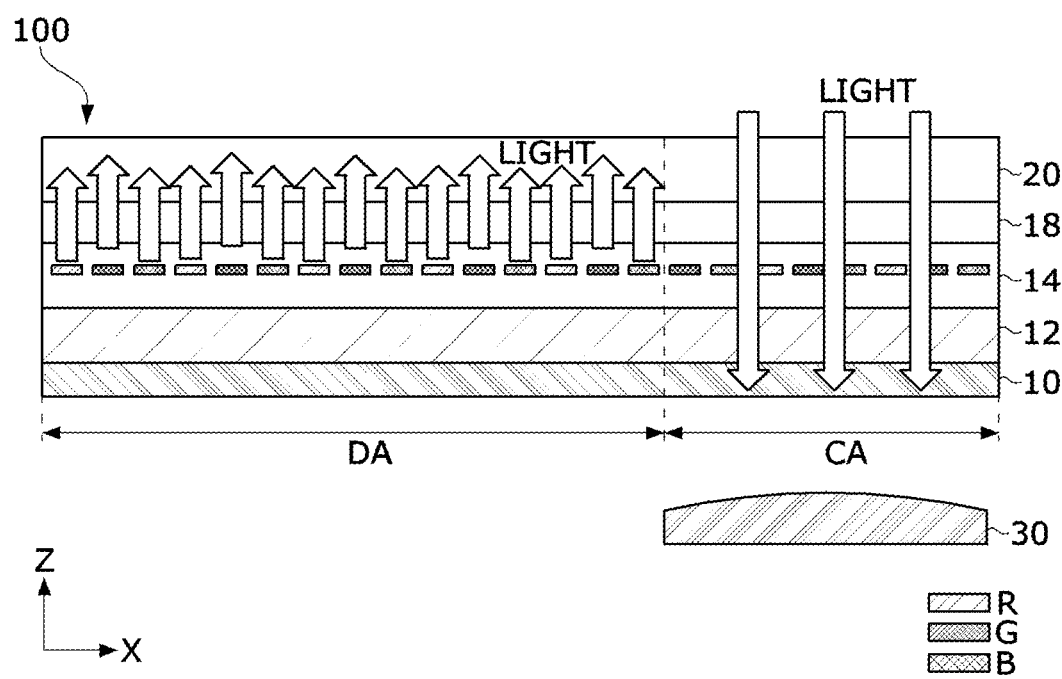
FIG. 1 is a cross-sectional view schematically illustrating a display panel according to one embodiment of the present disclosure.

Advantages and features of the present disclosure, and implementation methods thereof will be clarified through the following embodiments described with reference to the accompanying drawings. However, the present disclosure is not limited to embodiments disclosed herein and can be implemented in various different forms. The embodiments are provided for making the disclosure of the prevention disclosure thorough and for fully conveying the scope of the present disclosure to those skilled in the art. It is to be noted that the scope of the present disclosure is defined by the claims.

The figures, dimensions, ratios, angles, numbers, and the like disclosed in the drawings for describing the embodiments of the present disclosure are merely illustrative and are not limited to matters shown in the present disclosure. Like reference numerals refer to like elements throughout. Further, in describing the present disclosure, detailed descriptions of well-known technologies may be omitted when it is determined that they can unnecessarily obscure the gist of the present disclosure.

Terms such as "including" and "having" used herein are intended to allow other elements to be added unless the terms are used with the term "only". Any references to singular can include plural unless expressly stated otherwise.

Components are interpreted to include an ordinary error range even if not expressly stated.

For description of a positional relationship, for example, when the positional relationship between two parts is described as "on", "above", "below", "next to", and the like, one or more parts can be interposed therebetween unless the term "immediately" or "directly" is used in the expression.

While terms, such as "first", "second", etc., can be used to describe various components, such components must not be limited by the above terms. The above terms are used only to distinguish one component from another and may not define order.

For description of a temporal relationship, for example, when a temporal relationship is described as "after", "subsequently to", "next", "before", and the like, a non-consecutive case can be included unless the term "immediately" or "directly" is used in the expression.

The same reference numerals refer to the same elements throughout the specification.

The features of various embodiments of the present disclosure can be partially or entirely bonded to or combined with each other. The embodiments can be interoperated and performed in technically various ways and can be carried out independently of or in association with each other.

Hereinafter, various embodiments of the present disclosure will be described in detail with reference to the accompanying drawings.

Figure 2:
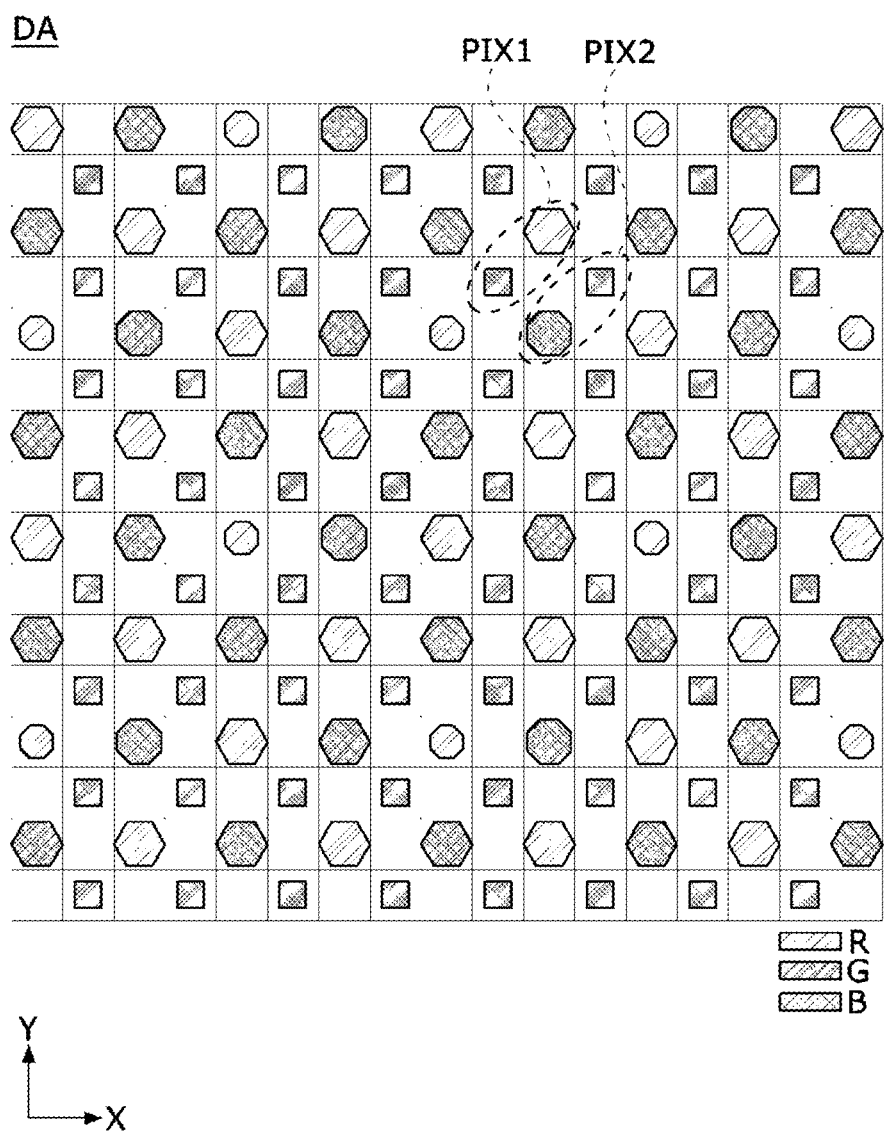
FIG. 2 is a view illustrating one example of a pixel disposition in a display region according to one embodiment of the present disclosure.

FIG. 1 is a cross-sectional view schematically illustrating a display panel according to one embodiment of the present disclosure, and FIG. 2 is a view illustrating one example of the pixel disposition in a display region according to one embodiment of the present disclosure.

Referring to FIGS. 1 and 2, a screen of a display panel 100 includes at least a display region DA and a sensing region CA. Each of the display region DA and the sensing region CA includes a pixel array where pixels to which pixel data is written are disposed. The number of pixels per unit area of the sensing region CA, for example, pixels per inch (PPI), is lower than that of the display region DA to secure transmittance of the sensing region CA.

The pixel array of the display region DA includes a pixel region (a first pixel region) where a plurality of pixels having a high PPI are disposed. The pixel array of the sensing region CA includes a pixel region (a second pixel region) where a plurality of pixel groups spaced apart from each other by light transmitting parts and thus having a relatively low PPI are disposed. In the sensing region CA, external light can pass through the display panel 100 through the light transmitting part having high light transmittance and can be received by a sensing element module under the display panel 100.

Since the display region DA and the sensing region CA include pixels, an input image can be reproduced on the display region DA and the sensing region CA.

Each of the pixels of the display region DA and the sensing region CA includes sub-pixels having different colors to realize a color of an image. The sub-pixels include a red sub-pixel (hereinafter, referred to as "an R sub-pixel"), a green sub-pixel (hereinafter, referred to as "a G sub-pixel"), and a blue sub-pixel (hereinafter, referred to as "a B sub-pixel"). Each of pixels P can further include a white sub-pixel (hereinafter, referred to as "a W sub-pixel"). Each of the sub-pixels can include a pixel circuit and a light emitting element OLED.

As an example, the sensing region CA comprises, but is not limited to, a light sensing region and/or an image capturing region, and the sensing element module comprises, but is not limited to, a light sensor module and/or an imaging element module. In the case that the light sensing region CA is an image capturing region and the sensing element module is an imaging element module, the image capturing region includes the pixels and an imaging element module disposed under the screen of the display panel 100. The input image is displayed through lens 30 of the imaging element module when the pixel data of the input image is written to the pixels of the image capturing region in a display mode. The imaging element module images an external image in an imaging mode and outputs photo or video image data. The lens of the imaging element module faces the image capturing region. The external light is incident on the lens of the imaging element module through the image capturing region, and the lens 30 condenses the light to an image sensor. The imaging element module images an external image in the imaging mode and outputs the photo or video image data.

In order to secure transmittance, an image quality compensation algorithm for compensating luminance and color coordinates of pixels in the sensing region CA can be applied due to the pixels removed from the sensing region CA.

In the present disclosure, since low resolution pixels are disposed in the sensing region CA, the display region of the screen is not limited due to the sensing element module, and thus a full-screen display can be implemented.

The display panel 100 has a width in an X-axis direction, a length in a Y-axis direction, and a thickness in a Z-axis direction. The display panel 100 includes a circuit layer 12 disposed on a substrate 10, and a light emitting element layer 14 disposed on the circuit layer 12. A polarizing plate 18 can be disposed on the light emitting element layer 14, and a cover glass 20 can be disposed on the polarizing plate 18.

The circuit layer 12 can include a pixel circuit connected to lines such as data lines, gate lines, power lines, and the like and a gate driving part connected to the gate lines. The circuit layer 12 can include circuit elements such as a transistor implemented as a thin film transistor (TFT), a capacitor, and the like. The lines and the circuit elements of the circuit layer 12 can be implemented as a plurality of insulating layers, two or more metal layers spaced apart from each other with an insulating layer therebetween, and an active layer including a semiconductor material.

The light emitting element layer 14 can include a light emitting element driven by the pixel circuit. The light emitting element can be implemented as an organic light emitting diode (OLED). The OLED includes an organic compound layer formed between an anode and a cathode. The organic compound layer can include a hole injection layer (HIL), a hole transport layer (HTL), an emission layer (EML), an electron transport layer (ETL), and an electron injection layer (EIL), but the present disclosure is not limited thereto. When a voltage is applied to the anode and cathode of the OLED, holes passing through the hole transport layer (HTL) and electrons passing through the electron transport layer (ETL) move to the emission layer (EML) and then form excitons, and thus visible light is emitted from the emission layer (EML). The light emitting element layer 14 can be disposed on pixels which selectively transmit red, green, and blue wavelengths, and can further include a color filter array.

The light emitting element layer 14 can be covered by a protective layer, and the protective layer can be covered by an encapsulation layer. The protective layer and the encapsulation layer can have a structure in which organic films and inorganic films are alternately stacked. The inorganic film blocks the penetration of moisture or oxygen. The organic film flattens the surface of the inorganic film. When the organic films and the inorganic films are stacked in multiple films, since a passage for moisture or oxygen is longer than that of a single layer, the penetration of moisture or oxygen which affects the light emitting element layer 14 can be effectively blocked.

The polarizing plate 18 can be attached to the encapsulation layer. The polarizing plate 18 improves outdoor visibility of the display device. The polarizing plate 18 reduces light reflected from a surface of the display panel 100 and blocks light reflected from the metal of the circuit layer 12 to improve the brightness of pixels. The polarizing plate 18 can be implemented as a linear polarizing plate or a circular polarizing plate in which a linear polarizing plate and a retardation film are bonded.

In the display panel of the present disclosure, each of the pixel regions of the display region DA and the sensing region CA can include a light shield layer. The light shield layer is removed from the light transmitting part of the sensing region to define the light transmitting part. The light shield layer includes an opening hole corresponding to a light transmitting part region. The light shield layer is removed from the opening hole. The light shield layer is formed of a metal or inorganic film having a lower absorption coefficient compared to a metal layer removed from the light transmitting part with respect to a wavelength of the laser beam used in a laser ablation process which removes the metal layer which is present in the light transmitting part.

Figure 3A:
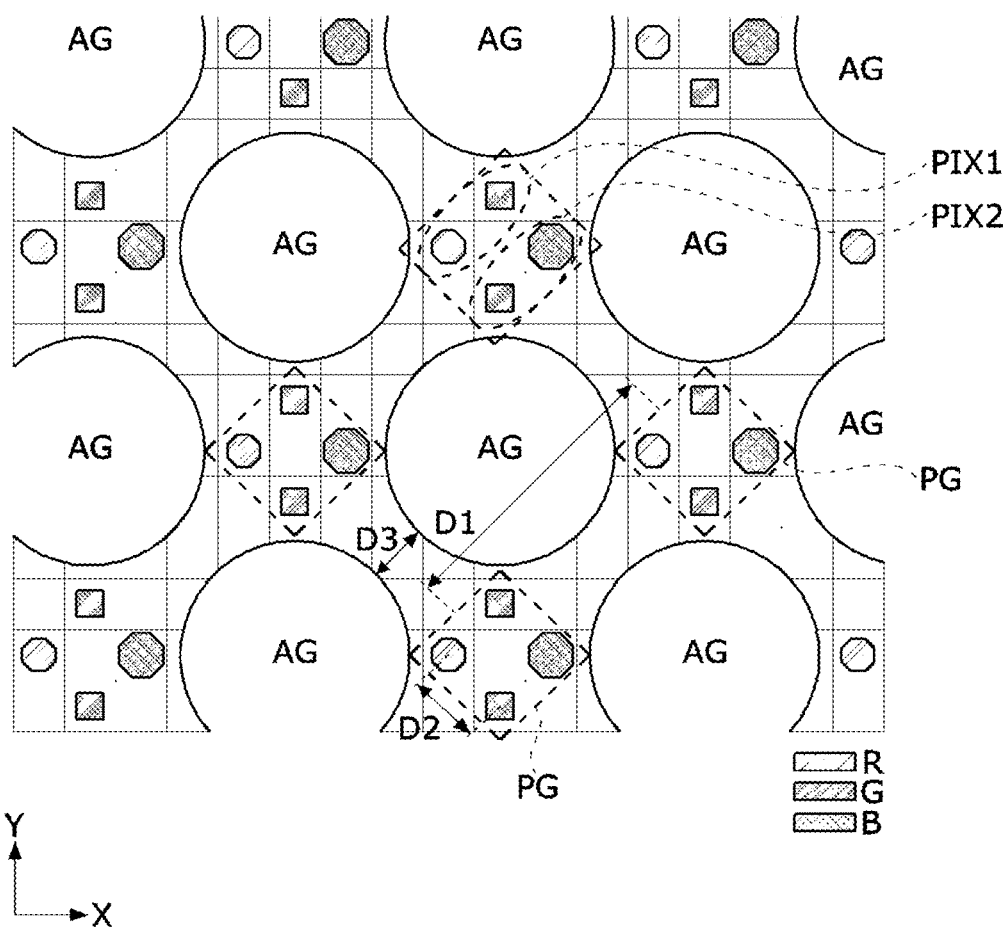
FIG. 3A is a view illustrating the pixels and light transmitting parts of a sensing region according to one embodiment of the present disclosure.
Figure 3B:
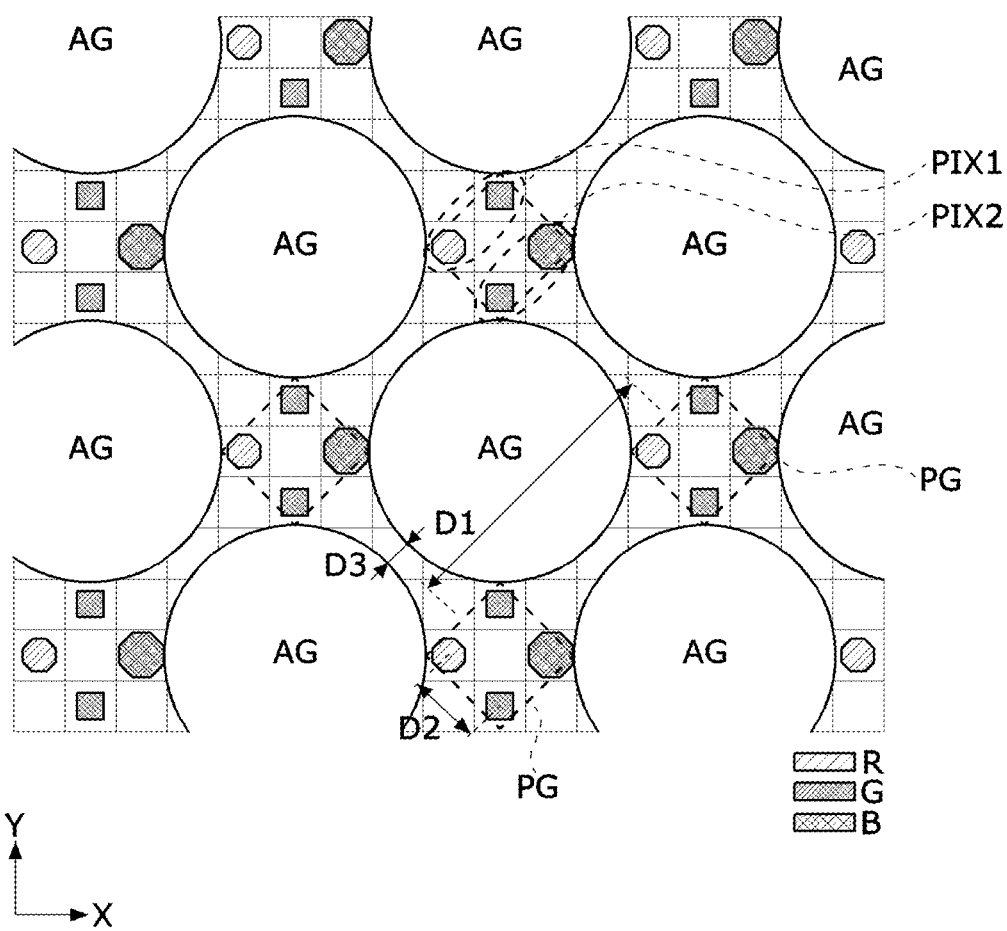
FIG. 3B is a view illustrating the pixels and light transmitting parts of a sensing region according to another embodiment of the present disclosure.

As mentioned, FIG. 2 is a view illustrating one example of the pixel disposition in the display region DA. FIG. 3A is a view illustrating one example of the pixels and the light transmitting parts of the sensing region CA. FIG. 3B is a view illustrating another example of the pixels and the light transmitting parts of the sensing region CA. Lines connected to the pixels are omitted in FIGS. 2, 3A and 3B.

Referring to FIG. 2, the display region DA includes pixels PIX1 and PIX2 arranged in a matrix form. Each of the pixels PIX1 and PIX2 can be implemented as a real type pixel in which R, G, and B sub-pixels of three primary colors are configured as one pixel. Each of the pixels PIX1 and PIX2 can further include a W sub-pixel. Further, two sub-pixels can be configured as one pixel using a sub-pixel rendering algorithm. For example, a first pixel PIX1 can be composed of the R and G sub-pixels, and a second pixel PIX2 can be composed of the B and G sub-pixels. Insufficient color representation in each of the pixels PIX1 and PIX2 can be compensated by an average value of corresponding color data between neighboring pixels.

Referring to FIG. 3A, the sensing region CA includes pixel groups PG spaced apart from each other by a predetermined pitch, and light transmitting parts AG disposed between neighboring pixel groups PG. External light is received by the lens of the sensing element module (in this case, the imaging element module) through the light transmitting parts AG. The light transmitting parts AG can include transparent media having high transmittance without metal so that the light can be incident with minimal light loss. In other words, the light transmitting parts AG can be formed of transparent insulating materials without including metal lines or pixels. The transmittance of the sensing region CA increases as the light transmitting parts AG increase.

The pixel group PG can include one or two pixels. Each of the pixels of the pixel group can include two to four sub-pixels. For example, one pixel in the pixel group can include R, G, and B sub-pixels or can include two sub-pixels, and can further include a W sub-pixel. In an example in FIG. 3A, the first pixel PIX1 is composed of the R and G sub-pixels, and the second pixel PIX2 is composed of the B and G sub-pixels, but the present disclosure is not limited thereto.

A distance D3 between the light transmitting parts AG is smaller than a pitch D1 between the pixel groups PG. A pitch D2 between the sub-pixels is smaller than the pitch D1 between the pixel groups PG.

FIG. 3B shows another example of the pixels and the light transmitting parts of the sensing region CA. The structure of another example as shown in FIG. 3B can be similar to that of the example as shown in FIG. 3A, except for the size of the light transmitting parts AG.

Specially, each of the light transmitting parts AG as shown in FIG. 3B is enlarged compared to the example as shown in FIG. 3A, and it is clear from FIG. 3B that the distance D3 between the light transmitting parts AG is smaller than the pitch D2 between the sub-pixels (for example, D3<D2). As a result, the light transmitting parts AG can be maximized and the transmittance in the sensing region CA can be improved.

A shape of each of the light transmitting parts AG is exemplified as a circular shape in FIGS. 3A and 3B, but is not limited thereto. For example, each of the light transmitting parts AG can be designed in various shapes such as a circular shape, an oval shape, a polygonal shape, and the like. The light transmitting parts AG can be defined as regions from which all metal layers are removed in the screen.

Figure 4:
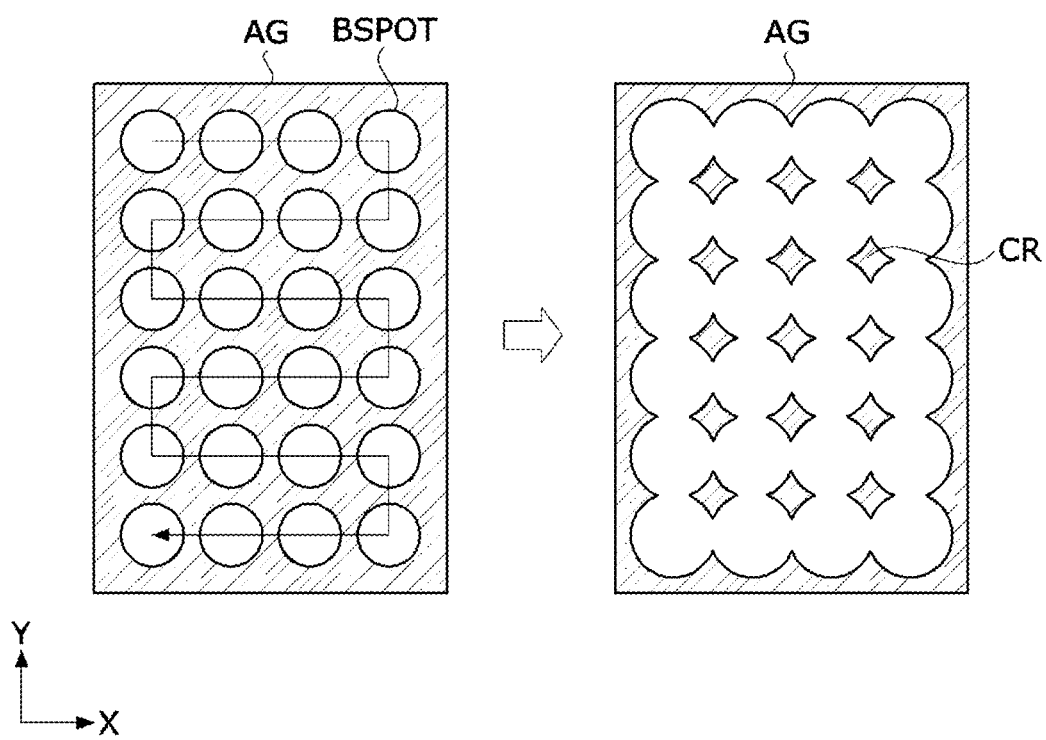
FIG. 4 is a view illustrating a point shot of a laser beam irradiated in a laser ablation process for partially removing a cathode layer in the sensing region.
Figure 5:
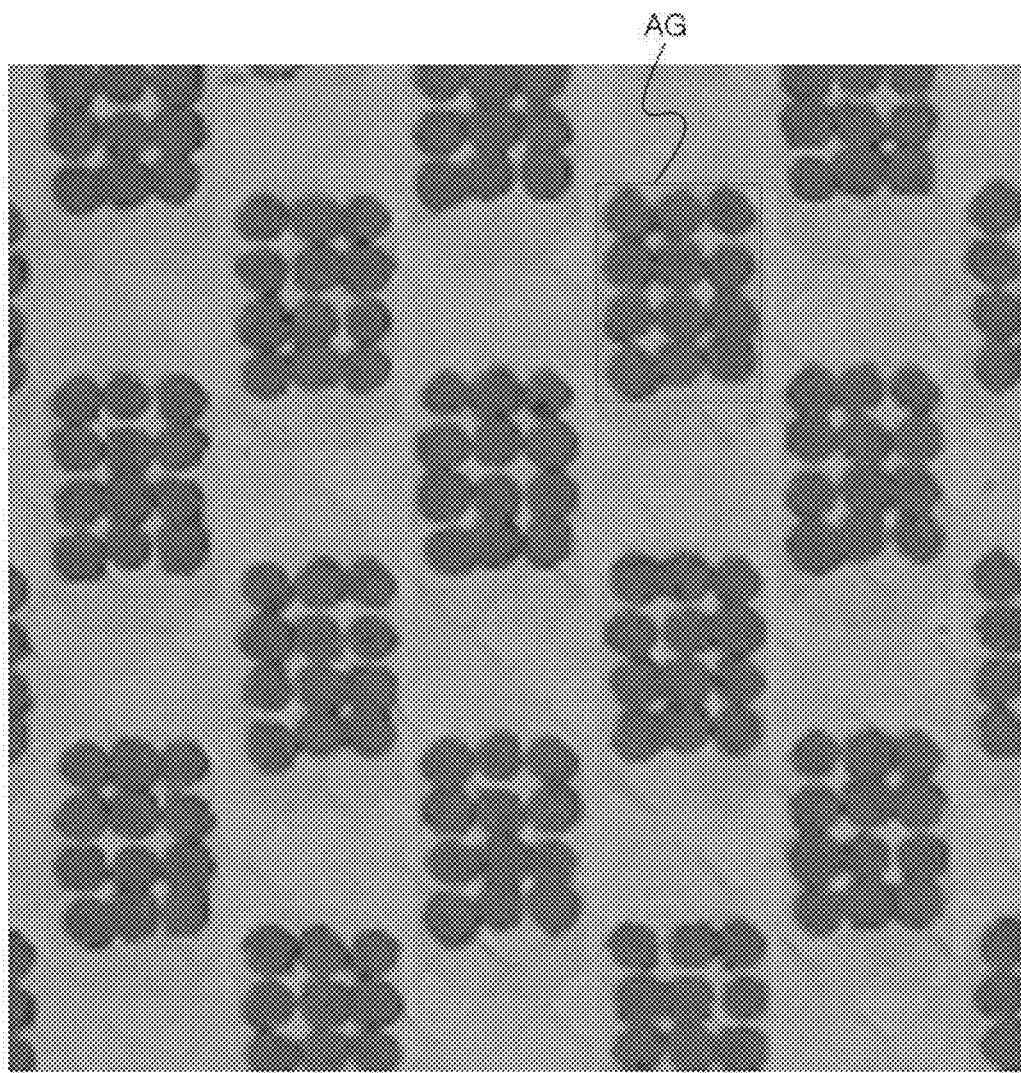
FIG. 5 is a photographic image illustrating a point shot of a laser beam irradiated to a metal layer as shown in FIG. 4.

All of the metal electrode materials are removed from the light transmitting parts AG. In a method of fabricating the display panel, metal used as a cathode can be uniformly deposited on an entire screen, and then a cathode layer can be removed only in the light transmitting parts of the sensing region CA in the laser ablation process. In the laser ablation process, the cathode layer can be melted and removed while irradiating a laser beam with a point shot and moving the laser beam along X-axis and Y-axis directions. The wavelength of the laser beam applied in the laser ablation process is selected as a wavelength having a high absorption coefficient of the cathode material. When the laser beam is irradiated to the light transmitting part region with a point shot, a diameter of a beam spot (BSPOT) of the beam formed on the cathode layer should be smaller than the light transmitting part AG as shown in FIG. 4. When the cathode layer of the light transmitting part AG is removed by the laser beam irradiated with a point shot, as shown in FIGS. 4 and 5, process time increases, and an undesired residual metal CR of the cathode layer not exposed to the beam spot can remain on the light transmitting part AG. When the laser beam is irradiated, a margin between the display region DA and the sensing region CA should be sufficiently secured so that cathodes of the pixels are not removed at a boundary between the display region DA and the sensing region CA.

In the laser ablation process, when the laser beam is irradiated to only the light transmitting part region with a point shot, the process time increases and the margin between the display region DA and the sensing region CA increases. Further, transmittance can be lowered and noise can be increased in an imaged image due to the undesired residual metal remaining in the light transmitting part region. In the present disclosure, in order to solve the problem of the laser ablation process using such a point shot, as shown in FIGS. 6A and 6B, a light shield layer which exposes a light transmitting part region is formed in the screen of the display panel 100, and in the laser ablation process, the laser beam is irradiated in the shape of a line beam or block beam.

Figure 6A:
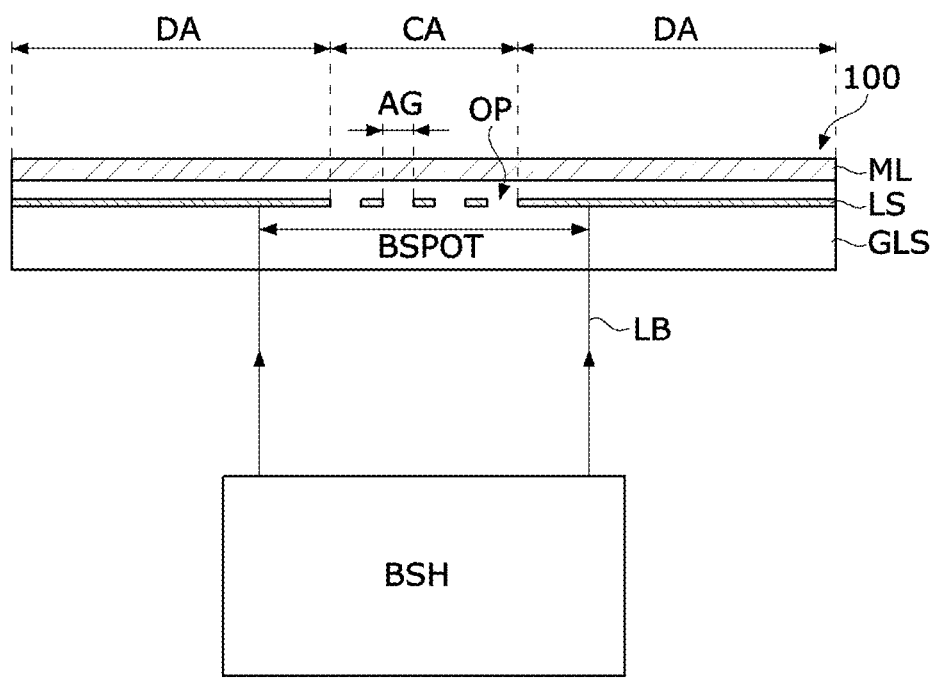
FIG. 6A is a view illustrating a schematic cross-sectional structure of the display panel according to one embodiment of the present disclosure and the laser beam irradiated in the laser ablation process.

FIG. 6A is a view illustrating a schematic cross-sectional structure of the display panel 100 according to one embodiment of the present disclosure and the laser beam irradiated in the laser ablation process. FIG. 6B is a view illustrating a schematic cross-sectional structure of the display panel according to another embodiment of the present disclosure and the laser beam irradiated in the laser ablation process.

Figure 6B:
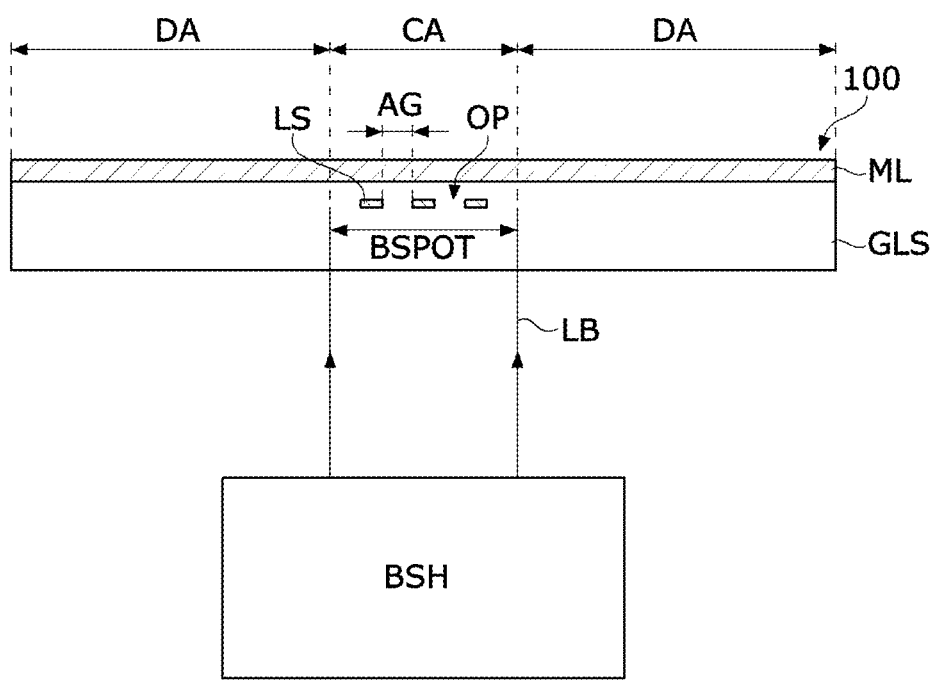
FIG. 6B is a view illustrating a schematic cross-sectional structure of the display panel according to another embodiment of the present disclosure and the laser beam irradiated in the laser ablation process.

Referring to FIGS. 6A and 6B, the display panel 100 includes a light shield layer LS which blocks the laser beam, and a metal layer ML exposed to the laser beam through an opening hole OP from which the light shield layer LS is removed.

According to one embodiment, as shown in FIG. 6A, the light shield layer LS can be deposited in the entire display region DA and the entire sensing region CA, and then is patterned in a photolithography process. In particular, the light shield layer LS can be formed in the entire display region DA and the entire sensing region CA, or in at least the pixel region in the display region DA and the sensing region CA, and is removed from an opening hole region which exposes the light transmitting part AG of the sensing region CA to define the opening hole OP. On the other hand, according to another embodiment, as shown in FIG. 6B, the light shield layer LS can be formed only in the sensing region CA, and is removed from an opening hole region which exposes the light transmitting part AG of the sensing region CA to define the opening hole OP. The pixel region refers to a region where the pixels PIX1 and PIX2 are disposed in each of the display region DA and the sensing region CA.

The metal layer ML is one of the metal layers required to drive the pixels of the display panel 100, and is a metal layer which should be removed from the light transmitting part AG of the sensing region CA. For example, the metal layer ML can be a cathode material layer or a metal layer formed on a layer other than the cathode material layer. When the metal layer ML is a metal which should be partially removed in the laser ablation process, a wavelength of a laser beam LB is determined in a wavelength band in which an absorption coefficient of this metal is high.

In a laser process, the light shield layer LS should protect the metal layer ML which is present in the screen other than the light transmitting part AG of the sensing region CA from the laser beam LB generated in the laser ablation process. To this end, the light shield layer LS should be selected from a material having a low absorption coefficient at a wavelength of the laser beam LB.

When the metal layer ML is an Mg/Ag alloy thin film layer used as a cathode material, Mg has a high absorption coefficient at a wavelength of 1,064 nm. On the other hand, amorphous silicon (a-Si) or molybdenum (Mo) has a low absorption coefficient at the wavelength of 1,064 nm. Accordingly, when the Mg/Ag alloy thin film layer is removed by the laser beam LB having the wavelength of 1,064 nm, the light shield layer LS for protecting the Mg/Ag thin film alloy layer from the laser beam in a region other than the light transmitting part includes a material with a low absorption coefficient at the wavelength of 1,064 nm, such as amorphous silicon (a-Si), molybdenum (Mo), or the like.

Due to the light shield layer LS formed on the display panel 100, the laser beam LB can be irradiated in the shape of the line beam or block beam in the laser ablation process. A length of the line beam or block beam can be greater than that of the sensing region CA. A length of a beam spot BSPOT of the laser beam LB irradiated to the display panel 100 in the shape of the line beam or block beam can be at least a length greater than or equal to the length of the sensing region CA in one direction (X-axis or Y-axis direction). When the beam spot BSPOT is irradiated greater than the sensing region CA, only a part of the metal layer ML in the light transmitting part region exposed from the opening hole OP without the light shield layer LS can be exposed to the laser beam, and the metal layer ML in another region shielded by the light shield layer LS can be protected from the laser beam.

A laser ablation apparatus can generate a line-shaped or block-shaped beam having a uniform laser beam intensity using a beam shaper or homogenizer (BSH). A line beam or a block beam can be generated according to a structure of the beam shaper BSH, and a size of the laser beam LB can be adjusted according to a distance between the beam shaper BSH and the substrate of the display panel 100.

When the laser beam LB is irradiated to the entire sensing region CA in the laser ablation process using the light shield layer LS formed on the display panel 100, the metal layer ML can be completely removed at the same time from the light transmitting parts AG in the sensing region CA. In this case, the metal layer ML present in a pixel array other than the light transmitting parts AG is protected from the laser beam LB by the light shield layer LS, and thus is not removed in the laser ablation process. The metal layer ML can be removed only from the light transmitting parts of the sensing region CA within the screen by only irradiating the laser beam once. Accordingly, in the present disclosure, the laser ablation process time can be minimized and the margin between the display region DA and the sensing region CA can be minimized. Further, in the present disclosure, the transmittance of the sensing region CA can be increased, and the noise of the imaged image data can be reduced by completely removing the metal layer ML without the residual metal from the light transmitting parts AG.

Figure 7:
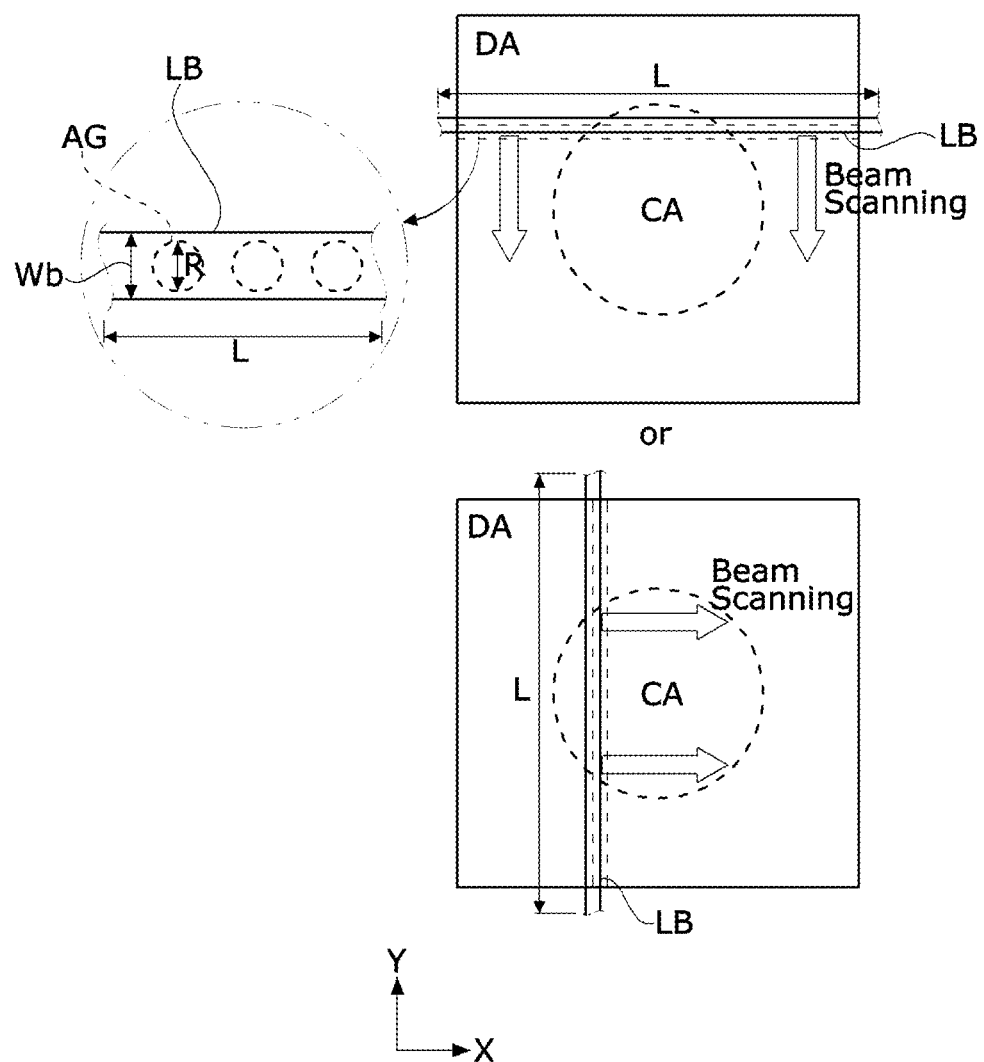
FIGS. 7 to 9 are views illustrating various laser beam spots according to one embodiment of the present disclosure.
Figure 8:
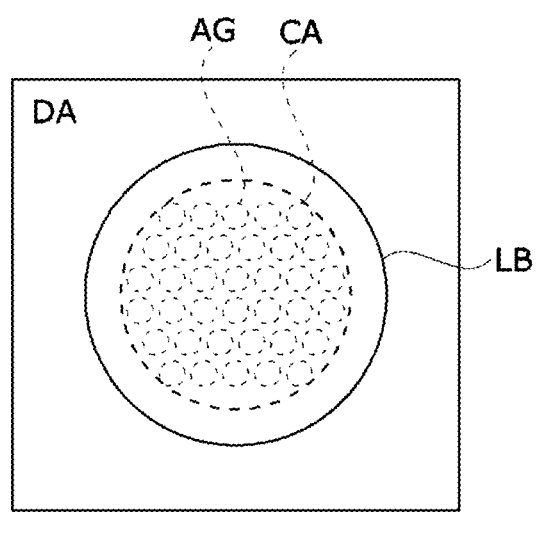
Figure 8:
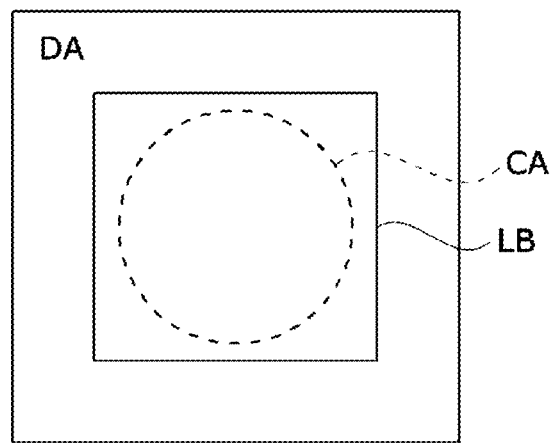
Figure 9:
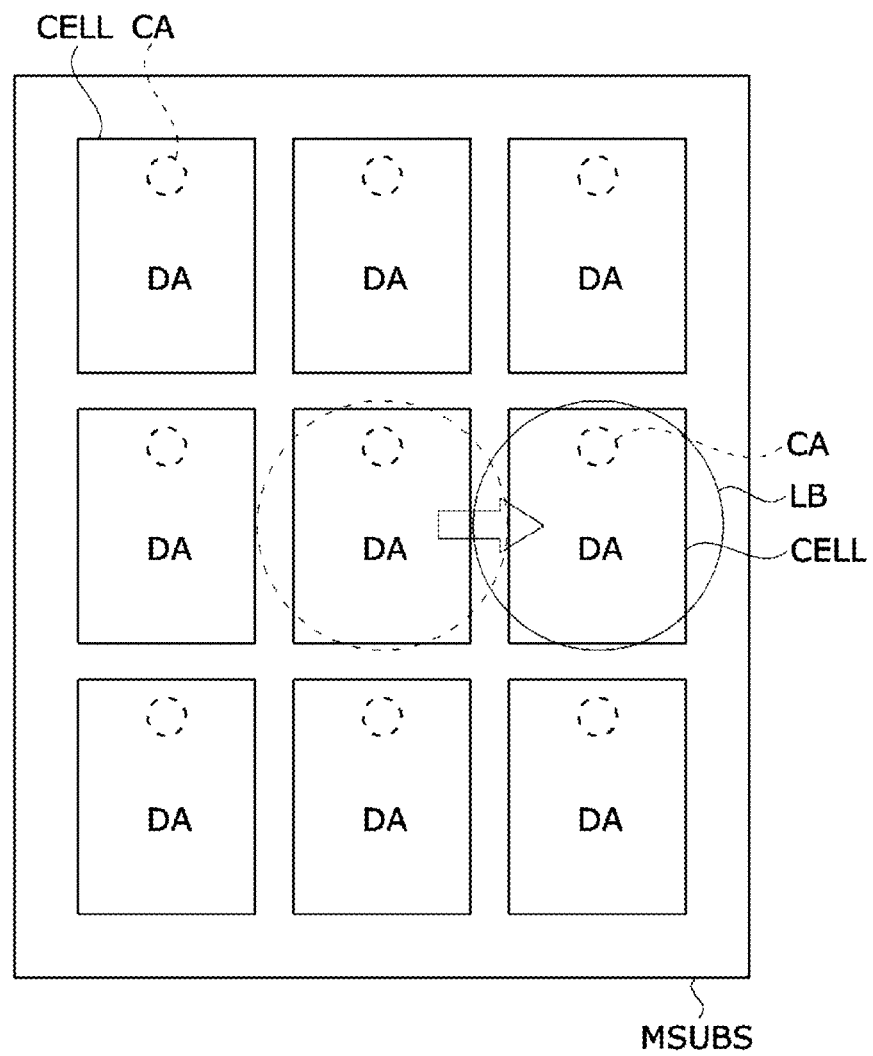

FIGS. 7 to 9 are views illustrating various laser beam spots, which are especially suitable to be used in a laser ablation process for manufacturing the display panel as shown in FIG. 6A, according to one embodiment of the present disclosure.

Referring to FIG. 7, in the laser ablation process, the laser beam LB is irradiated in a shape of a line beam which crosses the sensing region CA. Since only the metal layer ML exposed to the laser beam LB is removed through the opening hole OP without the light shield layer LS, the length of the laser beam LB can be sufficiently long. A width Wb of the laser beam LB can be greater than a diameter R or maximum length of the light transmitting part AG, and further, can be greater than or equal to a diameter or maximum length of the sensing region CA.

A length L of the laser beam LB can be greater than or equal to the maximum length of the sensing region CA. The laser beam LB irradiated to the display panel 100 in the shape of a line beam scans the display panel 100 while moving along a first direction (X or Y axis direction). The laser beam LB has a large beam spot, and thus can be irradiated to not only the sensing region CA, but also a part of the display region DA close to the sensing region CA, or an entire surface of the display region DA. At least a part of the laser beam can overlap between a previous shot and a current shot so that the metal residual metal does not remain in the light transmitting part AG of the sensing region CA while the laser beam LB moves along the first direction.

The laser beam LB can scan the display panel 100 along the first direction (X or Y axis direction) and then scan the display panel 100 along a second direction (X or Y axis direction) to surely remove the residual metal by removing the metal layer ML only in the light transmitting part region. Since the metal layer ML is a thin film, generally, the metal layer ML can be removed without the residual metal only by laser scanning in one direction.

Referring to FIG. 8, in the laser ablation process, the laser beam LB can be irradiated as a block beam having a size greater than or equal to the light transmitting part AG, and further, greater than or equal to the sensing region CA. Accordingly, since the beam spot of the laser beam LB irradiated in the shape of the block beam is large, the laser beam LB is irradiated to the entire surface of the light transmitting part AG in one shot, and further, can be irradiated to the entire surface of the sensing region CA in one shot. Since the beam spot of the block beam covers the entire surface of the sensing region CA, a metal layer selected from all the light transmitting parts AG of the sensing region CA, for example, the cathode can be removed by irradiation of the one-shot laser beam.

The shape, the size, and the like of the block beam are determined by the beam shaper (BSH), and the intensity of the laser beam is constant within a block. The block beam can be a circular beam or a quadrangular beam, but the shape is not limited to a specific shape.

Since only the metal layer ML exposed to the laser beam LB through the opening hole OP is removed, the size of the laser beam LB can be sufficiently large. For example, the block-shaped laser beam formed on the display panel 100 can be irradiated to not only the sensing region CA, but also a part of the display region DA close to the sensing region CA, or the entire surface of the display region DA in one shot. Accordingly, the metal layer ML of all light transmitting parts AG can be simultaneously removed from the screen without the residual metal with only one shot of the laser beam LB.

Referring to FIG. 9, numerous display panels 100 can be simultaneously manufactured through a multi-faceted process.

A process of forming a thin film on a plurality of cells CELL on a mother substrate MSUBS is simultaneously performed. Here, one cell is a single unit of the display panel 100. Circuit layers 12 of the cells CELL are simultaneously formed on the mother substrate MSUBS. The circuit layer 12 includes the light shield layer LS which exposes the light transmitting part region. When removing the metal layer in the circuit layer 12 formed in the light transmitting part region from the circuit layer 12, the laser ablation process can be performed.

In a fabricating process of the circuit layer 12, after the anode of the light emitting element (OLED) is formed, an organic compound layer of the light emitting element layer 14 starts to be deposited, and the light emitting element layers 14 of the cells CELL are simultaneously formed on the mother substrate MSUBS. After the protective layer and the encapsulation layer which cover the light emitting element layers 14 are coated, the mother substrate MSUBS is cut by a scribing wheel along a scribing line in a scribing process, and thus is separated in units of cells. After the scribing process, in a trimming process, a contour of each of the display panels 100 is trimmed by laser cutting equipment.

In the laser ablation process, the laser beam LB in the shape of the line beam or block beam can be irradiated to the mother substrate MSUBS. In this case, the size of the beam spot can be larger than that of the light transmitting part AG of the sensing region CA, and can have a size capable of completely covering the sensing region CA or a larger size capable of covering the unit cell CELL.

Figure 10:
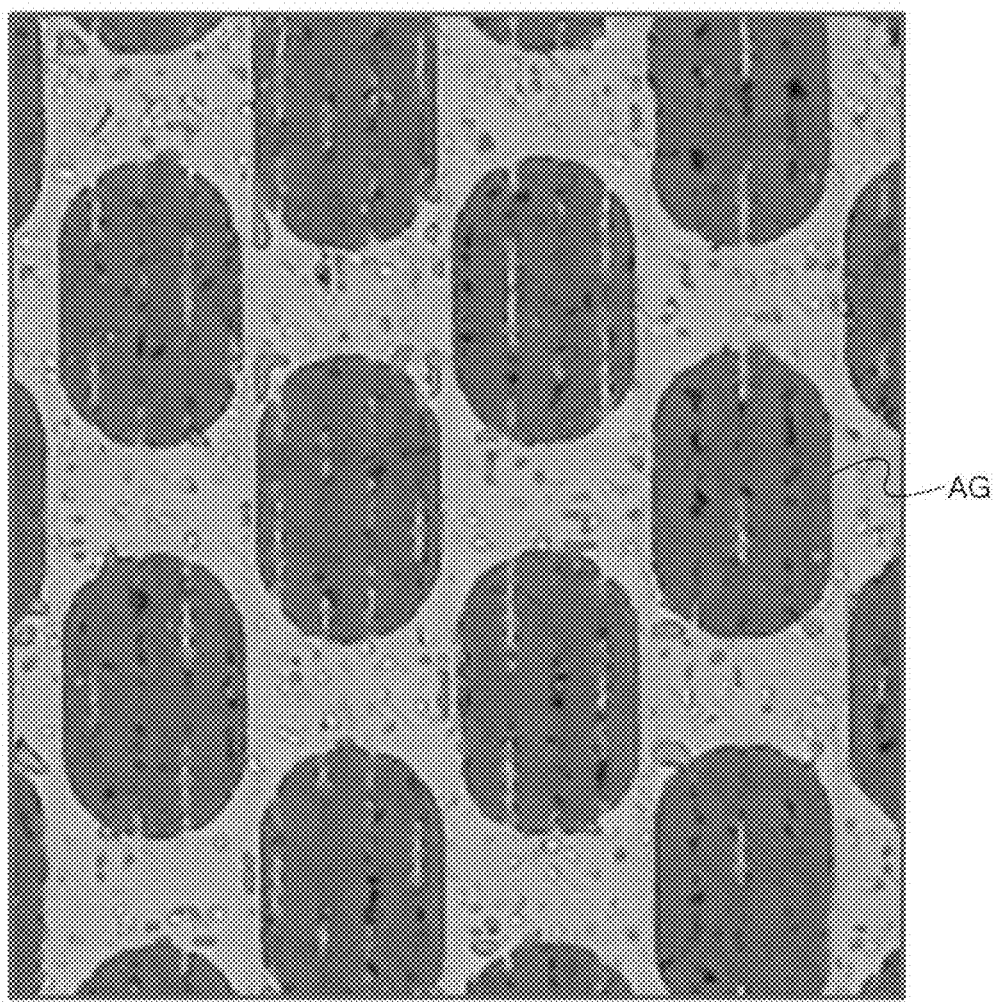
FIG. 10 is a photographic image illustrating an experimental result in which a metal layer is removed from a light transmitting part region after performing the laser ablation process according to one embodiment of the present disclosure.

FIG. 10 is a photographic image illustrating an experimental result in which the metal layer is removed from the light transmitting part region after performing the laser ablation process according to one embodiment of the present disclosure. As can be seen from FIG. 10, the metal layer ML can be cleanly removed from the light transmitting parts AG of the sensing region CA to which the laser beam is irradiated as shown in FIGS. 6A to 9 without the residual metal.

Figure 11:
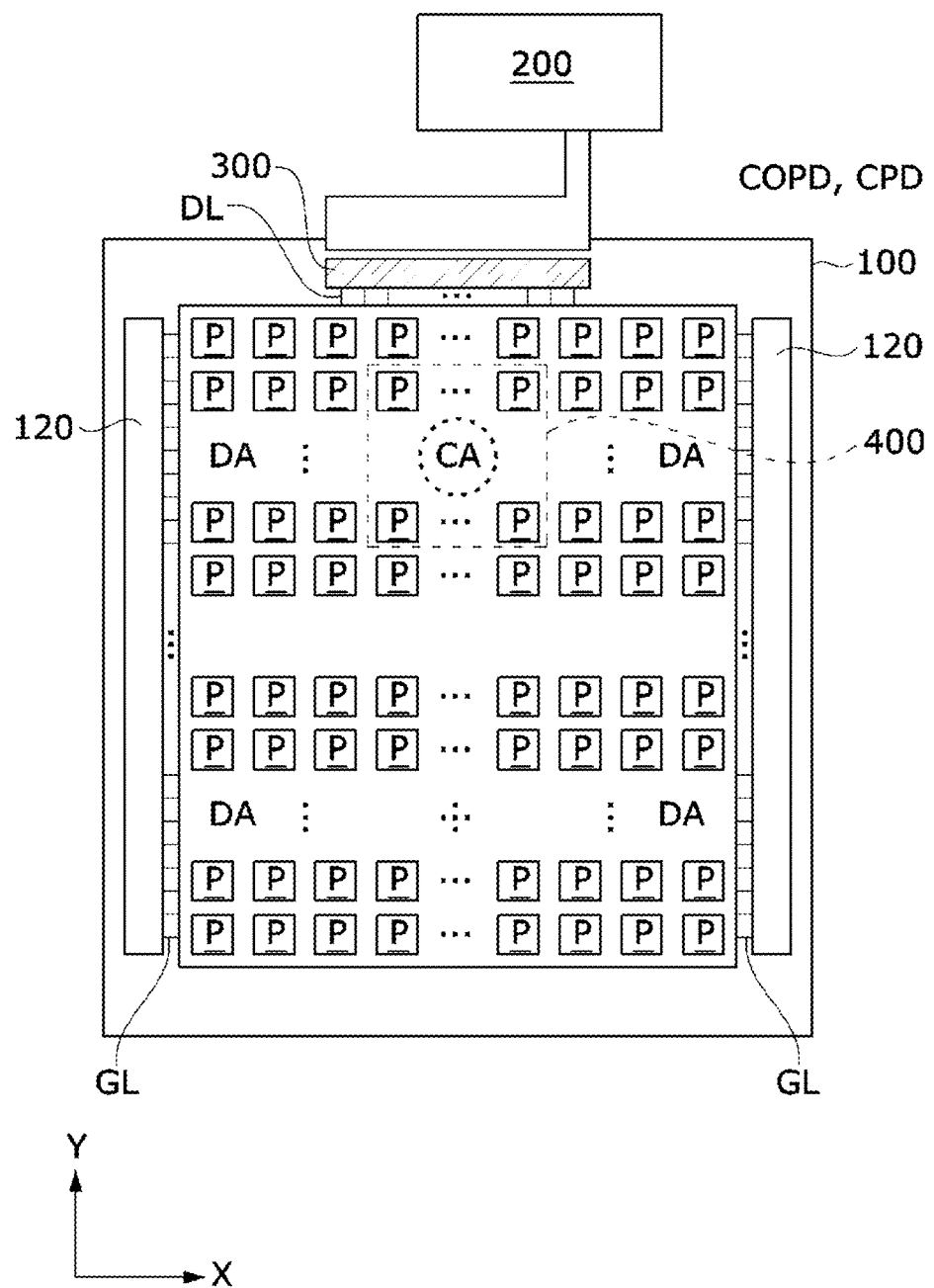
FIG. 11 is a block diagram illustrating a display panel and a display panel driving part according to one embodiment of the present disclosure.
Figure 12:
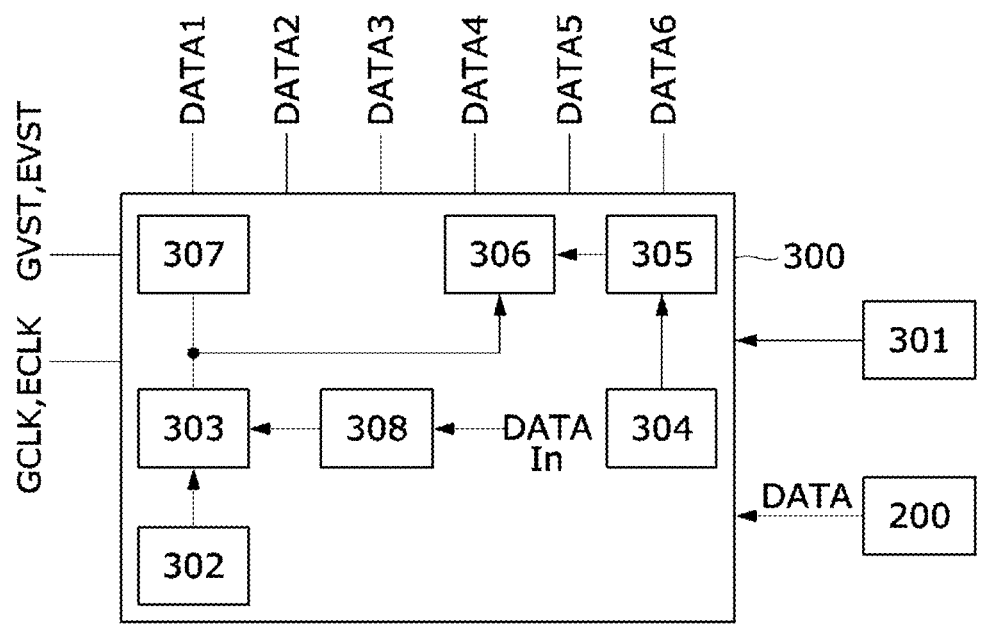
FIG. 12 is a block diagram schematically illustrating a configuration of a drive IC.

FIG. 11 is a block diagram illustrating the display panel and a display panel driving part according to one embodiment of the present disclosure. FIG. 12 is a block diagram schematically illustrating a configuration of a drive IC.

Referring to FIGS. 11 and 12, a display device includes the display panel 100 in which the pixel array is disposed on the screen, the display panel driving part, and the like.

The pixel array of the display panel 100 includes data lines DL, gate lines GL which intersect the data lines DL, and pixels P arranged in a matrix form defined by the data lines DL and the gate lines GL. The pixel array further includes power lines such as a VDD line PL1, a Vini line PL2, and a VSS line PL3 shown in FIGS. 13 and 14.

The pixel array can be divided into the circuit layer 12 and a light emitting element layer 14 as shown in FIG. 1. A touch sensor array can be disposed on the light emitting element layer 14. As described above, each of the pixels of the pixel array can include two to four sub-pixels. Each of the sub-pixels includes a pixel circuit disposed on the circuit layer 12.

A screen on which an input image is reproduced on the display panel 100 includes the display region DA and the sensing region CA.

The sub-pixels of each of the display region DA and the sensing region CA include the pixel circuit. The pixel circuit can include a driving element which supplies a current to a light emitting element (OLED), a plurality of switch elements which sample a threshold voltage of the driving element and switch a current path of the pixel circuit, a capacitor which maintains a gate voltage of the driving element, and the like. The pixel circuit is disposed under the light emitting element.

As an example, the sensing region CA includes the light transmitting parts AG disposed between the pixel groups, and an imaging element module (for example, a camera) 400 disposed under the sensing region CA. The imaging element module 400 photoelectrically converts light incident through the sensing region CA in an imaging mode using an image sensor, converts pixel data of the image output from the image sensor to digital data, and then outputs the imaged image data.

The display panel driving part writes the pixel data of the input image to the pixels P. The pixels P can be interpreted as pixel groups including a plurality of sub-pixels.

The display panel driving part includes a data driving part 306 which supplies a data voltage of the pixel data to the data lines DL, and a gate driving part 120 which sequentially supplies a gate pulse to the gate lines GL. The data driving part 306 can be integrated in a drive integrated circuit (IC) 300. The display panel driving part can further include a touch sensor driving part.

The drive IC 300 can be adhered to the display panel 100. The drive IC 300 receives the pixel data of the input image and a timing signal from a host system 200 to supply the data voltage of the pixel data to the pixels, and synchronizes the data driving part 306 and the gate driving part 120.

The drive IC 300 is connected to the data lines DL through data output channels to supply the data voltage of the pixel data to the data lines DL. The drive IC 300 can output a gate timing signal for controlling the gate driving part 120 through gate timing signal output channels. The gate timing signal generated from a timing controller 303 can include a gate start pulse VST, a gate shift clock CLK, and the like. The gate start pulse VST and the gate shift clock CLK swing between a gate-on voltage VGL and a gate-off voltage VGH. The gate timing signals VST and CLK output from a level shifter 307 are applied to the gate driving part 120 to control a shift operation of the gate driving part 120.

The gate driving part 120 can include a shift register formed on the circuit layer of the display panel 100 together with the pixel array. The shift register of the gate driving part 120 sequentially supplies a gate signal to the gate lines GL under control of the timing controller 303. The gate signal can include a scan pulse and an EM pulse of a light emission signal. The shift register can include a scan driving part which outputs the scan pulse and an EM driving part which outputs the EM pulse. In FIG. 12, GVST and GCLK are gate timing signals input to the scan driving part. EVST and ECLK are gate timing signals input to the EM driving part.

The drive IC 300 can be connected to the host system 200, a first memory 301, and the display panel 100. The drive IC 300 can include a data receiving and calculating part 308, the timing controller 303, the data driving part 306, a gamma compensation voltage generator 305, a power supply part 304, a second memory 302, and the like.

The data receiving and calculating part 308 includes a receiving part receiving the pixel data input as digital signals from the host system 200 and a data calculating part which processes the pixel data input through the receiving part to improve image quality. The data calculating part can include a data restoration part which decodes and restores compressed pixel data, and an optical compensation part which adds a predetermined optical compensation value to the pixel data. The optical compensation value can be set as a value for correcting luminance of each piece of pixel data based on luminance of the screen measured based on the camera image taken in the fabricating process.

The timing controller 303 provides the pixel data of the input image received from the host system 200 to the data driving part 306. The timing controller 303 generates a gate timing signal for controlling the gate driving part 120 and a source timing signal for controlling the data driving part 306 to control operation timings of the gate driving part 120 and the data driving part 306.

The data driving part 306 converts the digital data including the pixel data received from the timing controller 303 through a digital to analog converter (DAC) to a gamma compensation voltage to output the data voltage. The data voltage output from the data driving part 306 is supplied to the data lines DL of the pixel array through an output buffer connected to a data channel of the drive IC 300.

The gamma compensation voltage generator 305 divides a gamma reference voltage from the power supply part 304 through a divider circuit to generate a gamma compensation voltage for each gray level. The gamma compensation voltage is an analog voltage in which a voltage is set for each gray level of pixel data. The gamma compensation voltage output from the gamma compensation voltage generator 305 is provided to the data driving part 306.

The power supply part 304 generates the power required for driving the pixel array of the display panel 100, the gate driving part 120, and the drive IC 300 using a DC-DC converter. The DC-DC converter can include a charge pump, a regulator, a buck converter, a boost converter, and the like. The power supply part 304 can adjust a DC input voltage from the host system 200 to generate DC power such as the gamma reference voltage, the gate-on voltage VGL, a gate-off voltage VGH, a pixel driving voltage VDD, a low potential power voltage VSS, and an initialization voltage Vini. The gamma reference voltage is supplied to the gamma compensation voltage generator 305. The gate-on voltage VGL and the gate-off voltage VGH are supplied to the level shifter 307 and the gate driving part 120. The pixel power, such as the pixel driving voltage VDD, the low potential power voltage VSS, the initialization voltage Vini, and the like are commonly supplied to the pixels P. The initialization voltage Vini is set to a DC voltage lower than the pixel driving voltage VDD and lower than the threshold voltage of the light emitting element (OLED) to initialize main nodes of the pixel circuits and restrain light emission of the light emitting element (OLED).

The second memory 302 stores a compensation value, register setting data, and the like received from the first memory 301 when power is supplied to the drive IC 300. The compensation value can be applied to various algorithms to improve image quality. The compensation value can include the optical compensation value. The register setting data defines operations of the data driving part 306, the timing controller 303, the gamma compensation voltage generator 305, and the like. The first memory 301 can include a flash memory. The second memory 302 can include a static random-access memory (SRAM).

The host system 200 can be implemented as an application processor (AP). The host system 200 can transmit the pixel data of the input image to the drive IC 300 through a mobile industry processor interface (MIPI). The host system 200 can be connected to the drive IC 300 through a printed circuit, for example, a flexible printed circuit (FPC).

Meanwhile, the display panel 100 can be implemented as a flexible panel applicable to a flexible display. The flexible display can be changed in screen size by rolling, folding, and bending the flexible panel, and can be easily fabricated in various designs. The flexible display can be implemented as a rollable display, a foldable display, a bendable display, a slidable display, or the like. The flexible panel can be fabricated as a so-called "plastic OLED panel". The plastic OLED panel can include a back plate and a pixel array on an organic thin film bonded to the back plate. A touch sensor array can be formed on the pixel array.

The back plate can be a polyethylene terephthalate (PET) substrate. The pixel array and the touch sensor array can be formed on the organic thin film. The back plate can block moisture permeation toward the organic thin film so that the pixel array is not exposed to moisture. The organic thin film can be a polyimide (PI) substrate. A multi-layered buffer film made of an insulating material can be formed on the organic thin film. The circuit layer 12 and the light emitting element layer 14 can be stacked on the organic thin film.

In the display device of the present disclosure, the pixel circuit, the gate driving part, and the like disposed on the circuit layer 12 can include a plurality of transistors. The transistors can be implemented as an oxide thin film transistors (TFTs) including an oxide semiconductor, LTPS TFTs including low temperature polysilicon (LTPS), or the like. Each of the transistors can be implemented as a p-channel TFT or an n-channel TFT. In the embodiment, a description based on an example in which the transistors of the pixel circuit are implemented as p-channel TFTs is made, but the present disclosure is not limited thereto.

The transistor is a three-electrode element including a gate, a source, and a drain. The source is an electrode which supplies carriers to the transistor. In the transistor, the carriers start flowing from the source. The drain is an electrode through which the carriers exit from the transistor. In the transistor, the carriers flow from the source to the drain. In the case of the n-channel transistor, since the carriers are electrons, a source voltage is lower than a drain voltage so that the electrons can flow from the source to the drain. In the case of the n-channel transistor, current flows from the drain toward the source. In the case of the p-channel transistor (PMOS), since the carriers are holes, a source voltage is higher than a drain voltage so that the holes can flow from the source to the drain. In the p-channel transistor, since the holes flow from the source to the drain, current flows from the source toward the drain. It should be noted that the source and drain of the transistor are not fixed. For example, the source and drain can be changed according to the applied voltage. Accordingly, the disclosure is not limited due to the source and drain of the transistor. In the following description, the source and drain of the transistor will be referred to as first and second electrodes.

The gate pulse swings between the gate-on voltage and the gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, but is turned off in response to the gate-off voltage. In the case of the n-channel transistor, the gate-on voltage can be a gate high voltage VGH and the gate-off voltage can be a gate low voltage VGL. In the case of the p-channel transistor, the gate-on voltage can be the gate low voltage VGL, and the gate-off voltage can be the gate high voltage VGH.

The driving element of the pixel circuit can be implemented as a transistor. The driving element should have uniform electrical characteristics among all pixels, but due to process variations and element characteristic variations, there can be differences between pixels and the electrical characteristics can be changed according to the elapse of a display driving time. In order to compensate for electrical characteristics variations of the driving element, the display device can include an internal compensation circuit and an external compensation circuit. The internal compensation circuit samples a threshold voltage (Vth) and/or mobility ($\mu$) of the driving element, which is added to the pixel circuit in each of the sub-pixels and changes according to the electrical characteristics of the driving element, and compensates for the change in real time. The external compensation circuit transmits a threshold voltage and/or mobility of the driving element sensed through a sensing line connected to each of the sub-pixels to an external compensation part. The compensation part of the external compensation circuit compensates for changes of the electrical characteristics of the driving element by reflecting a sensing result and modulating the pixel data of the input image. Since the voltage of the pixel which is changed according to the electrical characteristics of an external compensation driving element is sensed, and the external circuit modulates the data of the input image based on the sensed voltage, the electrical characteristic variation of the driving element between the pixels is compensated for.

Figure 13:
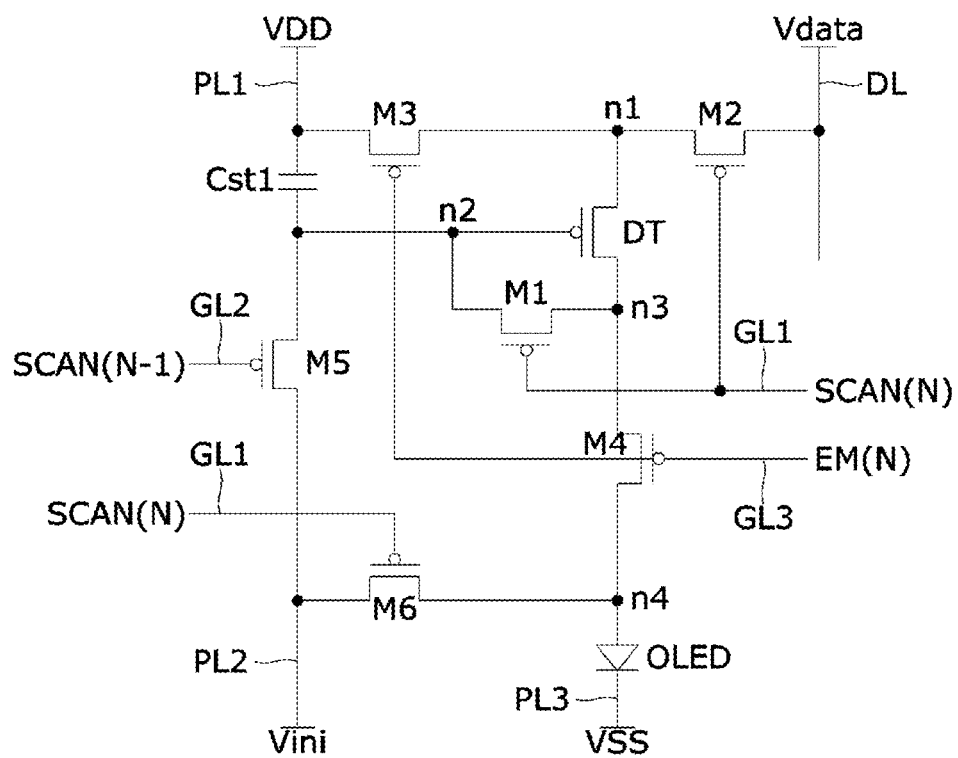
FIG. 13 is a circuit diagram illustrating an example of a pixel circuit.
Figure 14:
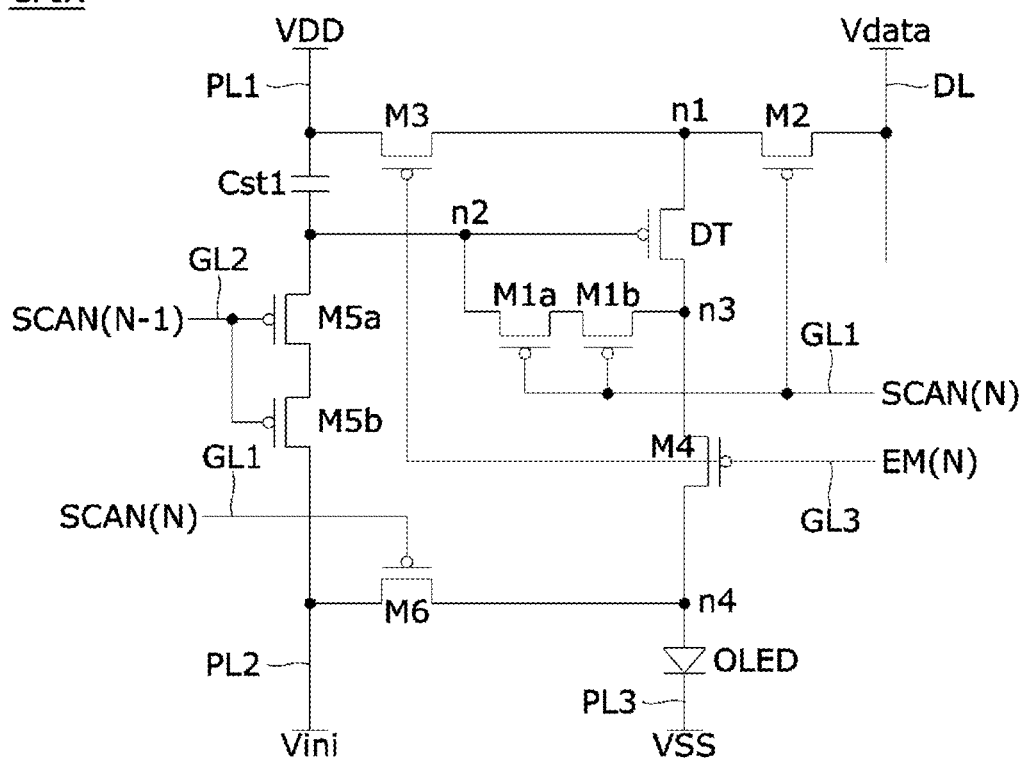
FIG. 14 is a circuit diagram illustrating another example of a pixel circuit.
Figure 15:
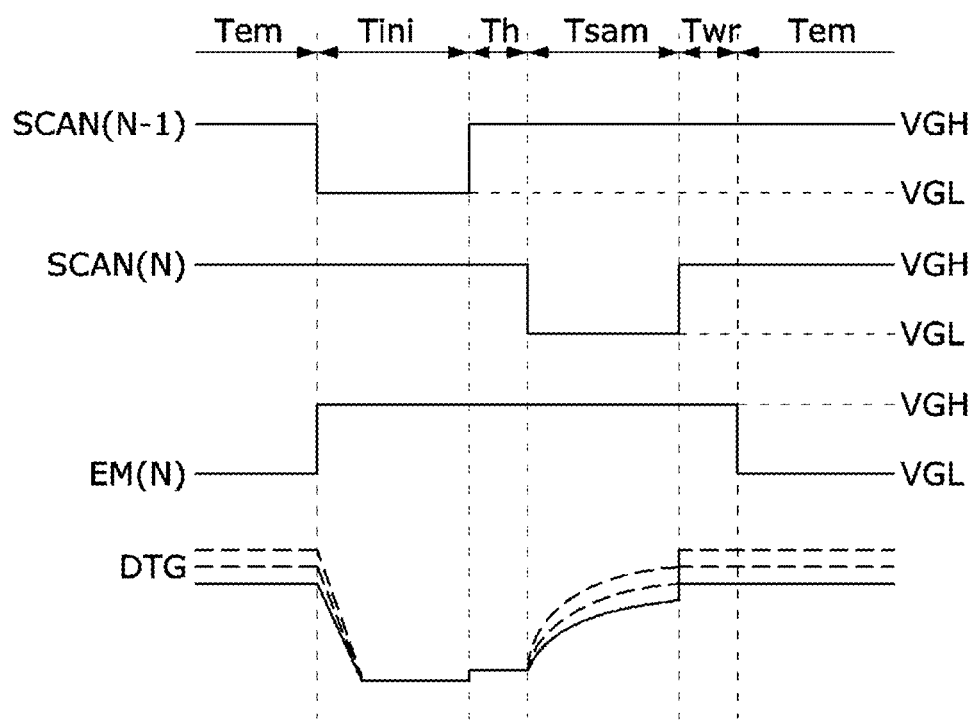
FIG. 15 is a view illustrating a method of driving the pixel circuit shown in FIGS. 13 and 14.

FIGS. 13 and 14 are circuit diagrams illustrating one example of the pixel circuit to which the internal compensation circuit is applied. FIG. 15 is a view illustrating a method of driving the pixel circuit shown in FIGS. 13 and 14. It should be noted that the pixel circuit of the present disclosure is not limited to FIGS. 13 and 14. The pixel circuits shown in FIGS. 13 and 14 can be equally applied to the pixel circuits of the display region DA and the sensing region CA. The pixel circuit applicable to the present disclosure can be implemented as the circuit shown in FIGS. 13 and 14, but is not limited thereto.

Referring to FIGS. 13 to 15, the pixel circuit includes a light emitting element OLED, a driving element DT which supplies a current to the light emitting element OLED, and an internal compensation circuit which compensates a gate voltage of the driving element DT as much as a threshold voltage Vth of the driving element DT by sampling the threshold voltage Vth of the driving element DT using a plurality of switch elements M1 to M6. Each of the driving element DT and the switch elements M1 to M6 can be implemented as a p-channel TFT.

A driving period of the pixel circuit using the internal compensation circuit can be divided into an initialization period Tini, a sampling period Tsam, a data writing period Twr, and a light emission period Tem as shown in FIG. 15.

During the initialization period Tini, an N−1th scan signal SCAN(N−1) is generated as a pulse of a gate-on voltage VGL, and a voltage of each of an Nth scan signal SCAN(N) and a light emission signal EM(N) is a gate-off voltage VGH. During the sampling period (Tsam), the Nth scan signal SCAN(N) is generated as a pulse of the gate-on voltage VGL, and a voltage of each of the N−1th scan signal SCAN(N−1) and the light emission signal EM(N) is the gate-off voltage VGH. During the data writing period Twr, the voltage of each of the N−1th scan signal SCAN(N−1), the Nth scan signal SCAN(N), and the light emission signal EM(N) is the gate-off voltage VGH. During at least some part of the light emission period Tem, the light emission signal EM(N) is generated as the gate-on voltage VGL, and the voltage of each of the N−1th scan signal SCAN(N−1) and the Nth scan signal SCAN (N) is generated as the gate-off voltage VGH.

During the initialization period Tini, a fifth switch element M5 is turned on according to the gate-on voltage VGL of the N−1th scan signal SCAN(N−1) to initialize the pixel circuit. During the sampling period Tsam, since first and second switch elements M1 and M2 are turned on according to the gate-on voltage VGL of the N-th scan signal SCAN (N), a threshold voltage of the driving element DT is sampled and stored in a capacitor Cst1. At the same time, a sixth switch element M6 is turned on during the sampling period Tsam to lower the voltage of a fourth node n4 to a reference voltage Vref to restrain the light emission of the light emitting element OLED. During the data writing period Twr, the first to sixth switch elements M1 to M6 maintain an off state. During the light emission period Tem, the third and fourth switch elements M3 and M4 are turned on so that the light emitting element OLED emits light. In the light emission period Tem, in order to accurately express luminance of low gray scale with a duty ratio of the light emission signal EM(N), the light emission signal EM(N) swings at a predetermined duty ratio between the gate-on low voltage VGL and the gate-off voltage VGH, and thus the third and fourth switch elements M3 and M4 can be repeatedly turned on/off.

The light emitting element OLED can be implemented as an organic light emitting diode or an inorganic light emitting diode. Hereinafter, an example in which the light emitting element OLED is implemented as an organic light emitting diode will be described.

The light emitting element OLED can include an organic compound layer formed between an anode and a cathode. The organic compound layer can include a hole injection layer HIL, a hole transport layer HTL, a light emitting layer EML, an electron transport layer ETL, and an electron injection layer EIL, but is not limited thereto. When the voltage is applied to the anode and cathode of the light emitting element OLED, since holes passing through the hole transport layer HTL and electrons passing through the electron transport layer ETL are moved to the emission layer (EML) and thus excitons are formed, visible light is emitted from the light emitting layer EML.

The anode of the light emitting element OLED is connected to the fourth node n4 between the fourth and sixth switch elements M4 and M6. The fourth node n4 is connected to the anode of the light emitting element OLED, a second electrode of the fourth switch element M4, and a second electrode of the sixth switch element M6. The cathode of the light-emitting element OLED is connected to the VSS line PL3 to which the low potential power supply voltage VSS is applied. The light emitting element OLED emits light with a current Ids flowing according to a gate-source voltage Vgs of the driving element DT. A current path of the light emitting element OLED is switched by the third and fourth switch elements M3 and M4.

The storage capacitor Cst1 is connected between the VDD line PL1 and a first node n1. The data voltage Vdata compensated by the threshold voltage Vth of the driving element DT is charged in the storage capacitor Cst1. Since the data voltage Vdata in each of the sub-pixels is compensated as much as the threshold voltage Vth of the driving element DT, the characteristic variation of the driving element DT is compensated for in the sub-pixels.

The first switch element M1 is turned on in response to the gate-on voltage VGL of the Nth scan pulse SCAN(N) to connect a second node n2 and a third node n3. The second node n2 is connected to a gate electrode of the driving element DT, a first electrode of the storage capacitor Cst1, and a first electrode of the first switch element M1. The third node n3 is connected to a second electrode of the driving element DT, a second electrode of the first switch element M1, and a first electrode of the fourth switch element M4. A gate electrode of the first switch element M1 is connected to the first gate line GL1 to receive the Nth scan pulse SCAN(N). The first electrode of the first switch element M1 is connected to the second node n2, and the second electrode of the first switch element M1 is connected to the third node n3.

Since the first switch element M1 is turned on only one very short horizontal period (1H) in which the Nth scan signal SCAN(N) is generated as the gate-on voltage VGL in one frame period and thus it is maintained in an off state for approximately one frame period, a leakage current can occur in the off state of the first switch element M1. In order to restrain the leakage current of the first switch element M1, the first switch element M1 can be implemented as a transistor having a dual gate structure in which two transistors M1a and M1b are connected in series as shown in FIG. 14.

The second switch element M2 is turned on in response to the gate-on voltage VGL of the Nth scan pulse SCAN(N) to supply the data voltage Vdata to the first node n1. A gate electrode of the second switch element M2 is connected to the first gate line GL1 to receive the Nth scan pulse SCAN(N). A first electrode of the second switch element M2 is connected to the first node n1. A second electrode of the second switch element M2 is connected to the data lines DL to which the data voltage Vdata is applied. The first node n1 is connected to the first electrode of the second switch element M2, a second electrode of the third switch element M3, and a first electrode of the driving element DT.

The third switch element M3 is turned on in response to the gate-on voltage VGL of the light emission signal EM(N) to connect the VDD line PL1 to the first node n1. A gate electrode of the third switch element M3 is connected to a third gate line GL3 to receive the light emission signal EM(N). A first electrode of the third switch element M3 is connected to the VDD line PL1. The second electrode of the third switch element M3 is connected to the first node n1.

The fourth switch element M4 is turned on in response to the gate-on voltage VGL of the light emission signal EM(N) to connect the third node n3 to the anode of the light emitting element OLED. A gate electrode of the fourth switch element M4 is connected to the third gate line GL3 to receive the light emission signal EM(N). The first electrode of the fourth switch element M4 is connected to the third node n3, and the second electrode of the fourth switch element M4 is connected to the fourth node n4.

The fifth switch element M5 is turned on in response to the gate-on voltage VGL of the N−1th scan pulse SCAN (N−1) to connect the second node n2 to the Vini line PL2. A gate electrode of the fifth switch element M5 is connected to a second gate line GL2 to receive the N−1th scan pulse SCAN(N−1). A first electrode of the fifth switch element M5 is connected to the second node n2, and a second electrode of the fifth switch element M5 is connected to the Vini line PL2. In order to restrain the leakage current of the fifth switch element M5, the fifth switch element M5 is implemented as a transistor having a dual gate structure in which two transistors M5a and M5b are connected in series as shown in FIG. 14.

The sixth switch element M6 is turned on in response to the gate-on voltage VGL of the Nth scan pulse SCAN(N) to connect the Vini line PL2 to the fourth node n4. A gate electrode of the sixth switch element M6 is connected to the first gate line GL1 to receive the Nth scan pulse SCAN(N). A first electrode of the sixth switch element M6 is connected to the Vini line PL2, and the second electrode of the sixth switch element M6 is connected to the fourth node n4.

The driving element DT drives the light emitting element OLED by controlling the current Ids flowing through the light emitting element OLED according to the gate-source voltage Vgs. The driving element DT includes a gate connected to the second node n2, a first electrode connected to the first node n1, and a second electrode connected to the third node n3.

As shown in FIG. 15, during the initialization period Tini, the N−1th scan pulse SCAN(N−1) is generated as the gate-on voltage VGL. The Nth scan pulse SCAN(N) and the light emission signal EM(N) maintain the gate-off voltage VGH during the initialization period Tini. Accordingly, since the fifth switch element M5 is turned on during the initialization period Tini, the second and fourth nodes n2 and n4 are initialized to the initialization voltage Vini. A hold period Th can be set between the initialization period Tini and the sampling period Tsam. In the hold period Th, the gate pulses SCAN(N−1), SCAN(N), EM(N) maintain previous states.

During the sampling period Tsam, the Nth scan pulse SCAN(N) is generated as the gate-on voltage VGL. The pulse of the Nth scan pulse SCAN(N) is synchronized with the data voltage Vdata of an Nth pixel line. The N−1th scan pulse SCAN(N−1) and the light emission signal EM(N) maintain the gate-off voltage VGH during the sampling period Tsam. Accordingly, the first and second switch elements M1 and M2 are turned on during the sampling period Tsam.

During the sampling period Tsam, a gate voltage DTG of the driving element DT increases due to the current flowing through the first and second switch elements M1 and M2. When the driving element DT is turned off, the gate node voltage DTG is Vdata−|Vth|. In this case, the voltage of the first node n is also Vdata−|Vth|. During the sampling period Tsam, the gate-source voltage Vgs of the driving element DT is |Vgs|=Vdata−(Vdata−|Vth|)=|Vth|.

During the data writing period Twr, the Nth scan pulse SCAN(N) is inverted to the gate-off voltage VGH. The N−1th scan pulse SCAN(N−1) and the light emission signal EM(N) maintain the gate-off voltage VGH during the data writing period Twr. Accordingly, all switch elements M1 to M6 maintain the off state during the data writing period Twr.

During the light emission period Tem, the light emission signal EM(N) can be generated as the gate-on voltage VGL. During the light emission period Tem, the light emission signal EM(N) is turned on and off at a predetermined duty ratio to improve low gray scale expression, and thus can swing between the gate-on voltage VGL and the gate-off voltage VGH. Accordingly, the light emission signal EM(N) can be generated as the gate-on voltage VGL during at least some part of the light emission period Tem.

When the light emission signal EM(N) is the gate-on voltage VGL, since a current flows from VDD to the light emitting element OLED, the light emitting element OLED can emit light. During the light emission period Tem, the N−1th and Nth scan pulses SCAN(N−1) and SCAN(N) maintain the gate-off voltage VGH. During the light emission period Temp, the third and fourth switch elements M3 and M4 repeat on and off operations according to the voltage of the light emission signal EM. When the light emission signal EM(N) is the gate-on voltage VGL, since the third and fourth switch elements M3 and M4 are turned on, a current flows through the light emitting element OLED. In this case, the gate-source voltage Vgs of the driving element DT is |Vgs|=VDD−(Vdata−|Vth|), and the current flowing through the light emitting element OLED is K(VDD−Vdata)2. K is a constant value determined by charge mobility, a parasitic capacitance, a channel capacity of the driving element DT, and the like.

Figure 16:
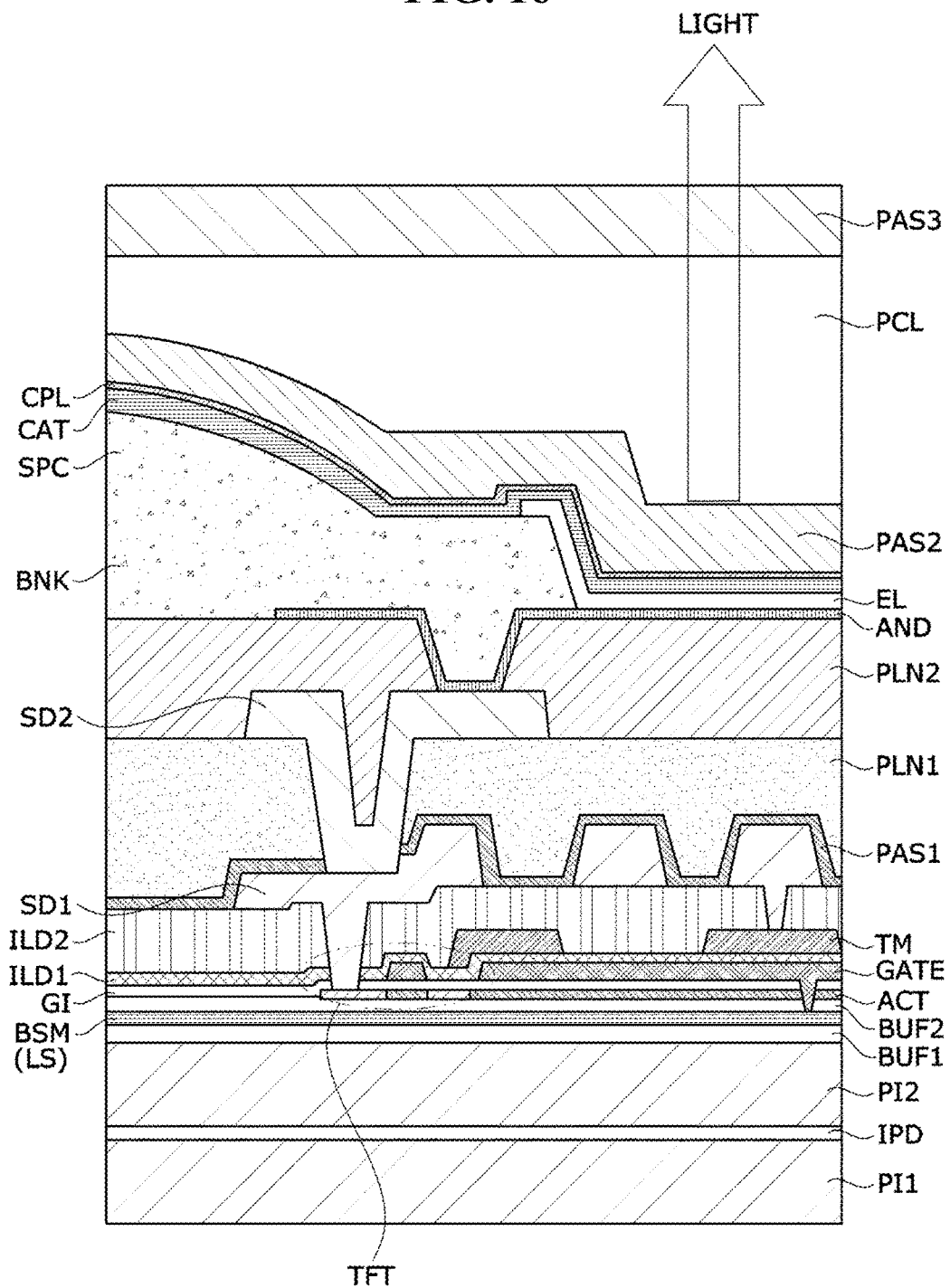
FIG. 16 is a cross-sectional view illustrating a cross-sectional structure of a pixel region in the display panel according to one embodiment of the present disclosure in detail.

FIG. 16 is a cross-sectional view illustrating the cross-sectional structure of the display panel according to one embodiment of the present disclosure in detail. It should be noted that the cross-sectional structure of the display panel 100 is not limited to FIG. 16. In FIG. 16, TFT represents the driving element DT of the pixel circuit.

Referring to FIG. 16, the circuit layer 12, the light emitting element layer 14, and the like can be stacked on substrates PI1 and PI2. The substrates PI1 and PI2 can include first and second PI substrates PI1 and PI2. An inorganic film IPD can be formed between the first PI substrate PI1 and the second PI substrate PI2. The inorganic film IPD blocks moisture penetration.

Figure 21:
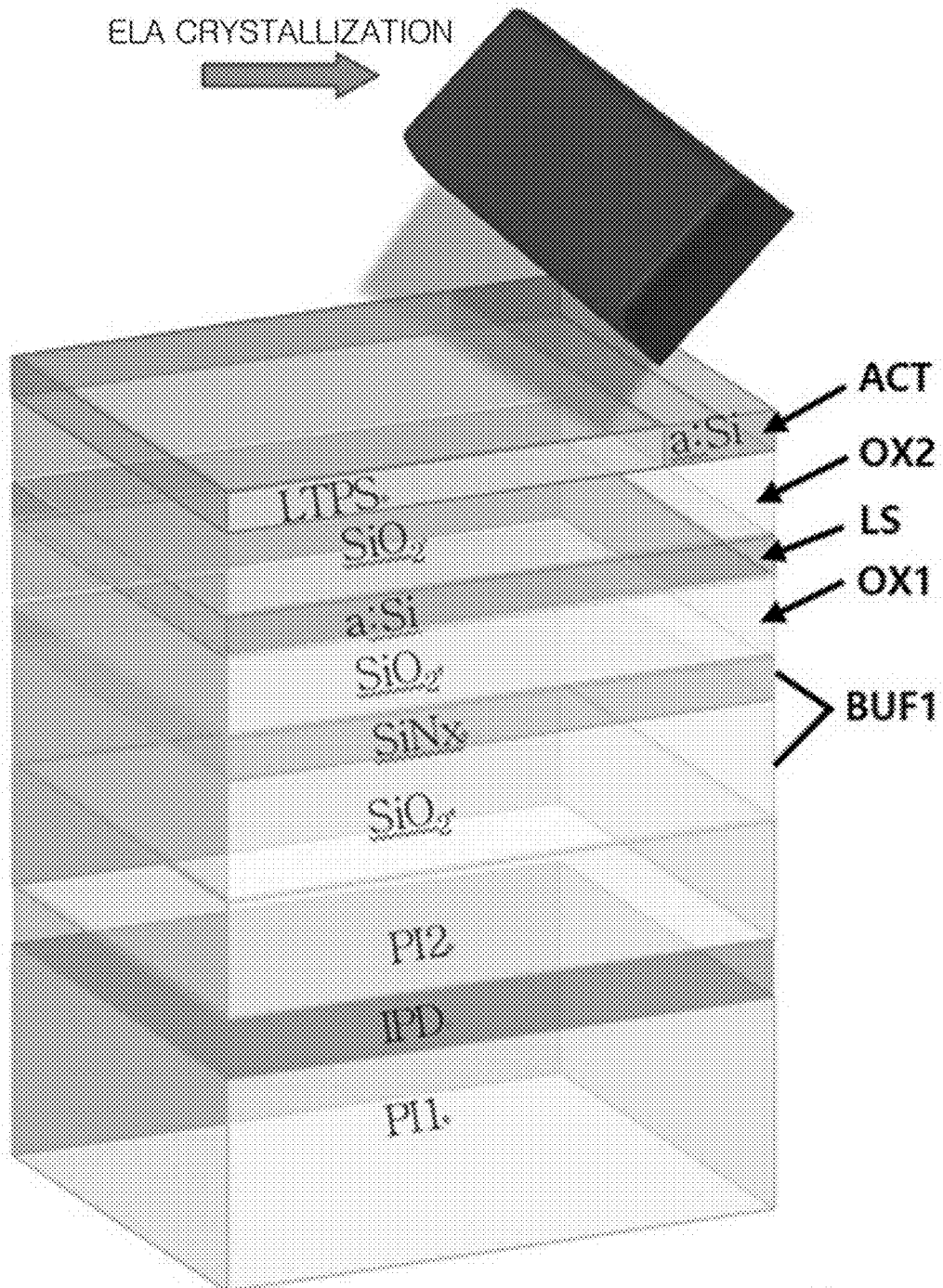
FIG. 21 is a view illustrating a laser crystallization process of amorphous silicon used as a semiconductor layer.

A first buffer layer BUF1 can be formed on the second PI substrate PI2. As shown in FIG. 21, the first buffer layer BUF1 can be formed of a multi-layered insulating film in which two or more oxide films $SiO_2$ and nitride films $SiN_x$ are stacked. A first metal layer can be formed on the first buffer layer BUF1, and a second buffer layer BUF2 can be formed on the first metal layer. The first metal layer is patterned in the photolithography process. The first metal layer can include a bottom shield metal pattern BSM. The bottom shield metal pattern BSM blocks external light so that light is not irradiated to an active layer of the TFT and thus prevents a photocurrent of the TFT formed in the pixel region. When the bottom shield metal pattern BSM is formed of a metal having a lower absorption coefficient of the laser wavelength used in the laser ablation process compared to the metal layer ML which should be removed from the sensing region CA, the bottom shield metal pattern BSM can also serve as the light shield layer LS which blocks the laser beam LB in the laser ablation process.

Each of the first and second buffer layers BUF1 and BUF2 can be formed of an inorganic insulating material and can be formed of one or more insulating layers.

An active layer ACT is formed of a semiconductor material deposited on the second buffer layer BUF2 and can be patterned by a photolithography process. The active layer ACT includes an active pattern of each of the TFTs of the pixel circuit and the TFTs of the gate driving part. A portion of the active layer ACT can be metallized by ion doping. The metallized portion can be used as a jumper pattern which connects metal layers at some nodes of the pixel circuit to connect components of the pixel circuit.

A gate insulating layer GI can be formed on the second buffer layer BUF2 to cover the active layer ACT. The gate insulating layer GI can be formed of an inorganic insulating material. A second metal layer can be formed on the gate insulating layer GI. The second metal layer can be patterned by a photolithography process. The second metal layer can include gate lines and a gate electrode pattern GATE, a lower electrode of the storage capacitor Cst1, a jumper pattern which connects patterns of the first metal layer and a third metal layer, and the like.

A first interlayer insulating layer ILD1 can be formed on the gate insulating layer GI to cover the second metal layer. The third metal layer can be formed on the first interlayer insulating layer ILD1, and a second interlayer insulating layer ILD2 can cover the third metal layer. The third metal layer can be patterned by a photolithography process. The third metal layer can include metal patterns TM such as an upper electrode of the storage capacitor Cst1. The first and second interlayer insulating layers ILD1 and ILD2 can include an inorganic insulating material.

A fourth metal layer can be formed on the second interlayer insulating layer ILD2, and an inorganic insulating layer PAS1 and a first planarization layer PLN1 can be stacked thereon. A fifth metal layer can be formed on the first planarization layer PLN1.

Some patterns of the fourth metal layer can be connected to the third metal layer through a contact hole passing through the first planarization layer PLN1 and the inorganic insulating layer PAS1. The first and second planarization layers PLN1 and PLN2 can be formed of an organic insulating material which flattens a surface.

The fourth metal layer can include the first and second electrodes of the TFT connected to the active pattern of the TFT through a contact hole passing through the second interlayer insulating layer ILD2. The data lines DL and the power lines PL1, PL2, and PL3 can be implemented as a fourth metal layer pattern SD1 or a fifth metal layer pattern SD2.

An anode AND of the light emitting element OLED can be formed on the second planarization layer PLN2. The anode AND can be connected to the electrodes of the TFT used as a switch element or a driving element through a contact hole passing through the second planarization layer PLN2. The anode AND can be formed of a transparent or translucent electrode material.

A pixel definition film BNK can cover the anode AND of the light emitting element OLED. The pixel definition film BNK is formed in a pattern which defines a light emitting region (or an opening region) through which light passes from each of the pixels to the outside. A spacer SPC can be formed on the pixel definition film BNK. The pixel definition film BNK and the spacer SPC can be integrated with the same organic insulating material. The spacer SPC secures a gap between a fine metal mask (FMM) and the anode AND so that the FMM does not come into contact with the anode AND in a deposition process of an organic compound EL.

The organic compound EL is formed in the light emitting region of each of the pixels defined by the pixel definition film BNK. A cathode CAT of the light emitting element OLED is formed on the entire surface of the display panel 100 to cover the pixel definition film BNK, the spacer SPC, and the organic compound EL. The cathode CAT can be connected to the VSS line PL3 formed by any one of the metal layers thereunder. A capping layer CPL can cover the cathode CAT. The capping layer CPL blocks penetration of out gassing of the organic insulating material applied on the capping layer CPL and air by being formed of an inorganic insulating material on the cathode CAT to protect the cathode CAT. An inorganic insulating layer PAS2 can cover the capping layer CPL, and a planarization layer PCL can be formed on the inorganic insulating layer PAS2. The planarization layer PCL can include an organic insulating material. An inorganic insulating layer PAS3 of the encapsulation layer can be formed on the planarization layer PCL.

Figure 17:
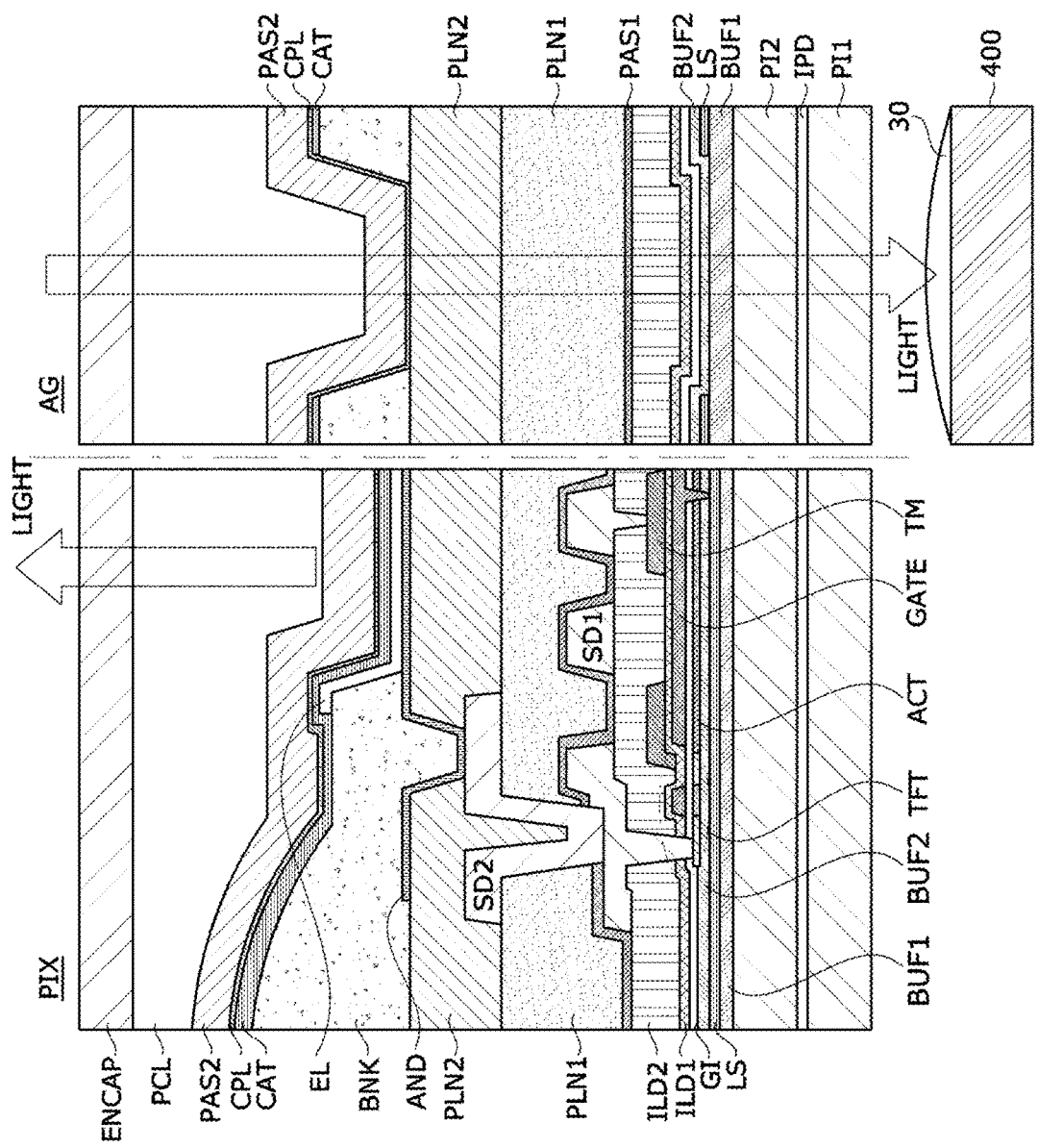
FIGS. 17 and 18 are cross-sectional views illustrating a light shield layer of the pixel region and the light transmitting part of the sensing region in a cross-sectional structure of the display panel according to various embodiments of the present disclosure.
Figure 18:
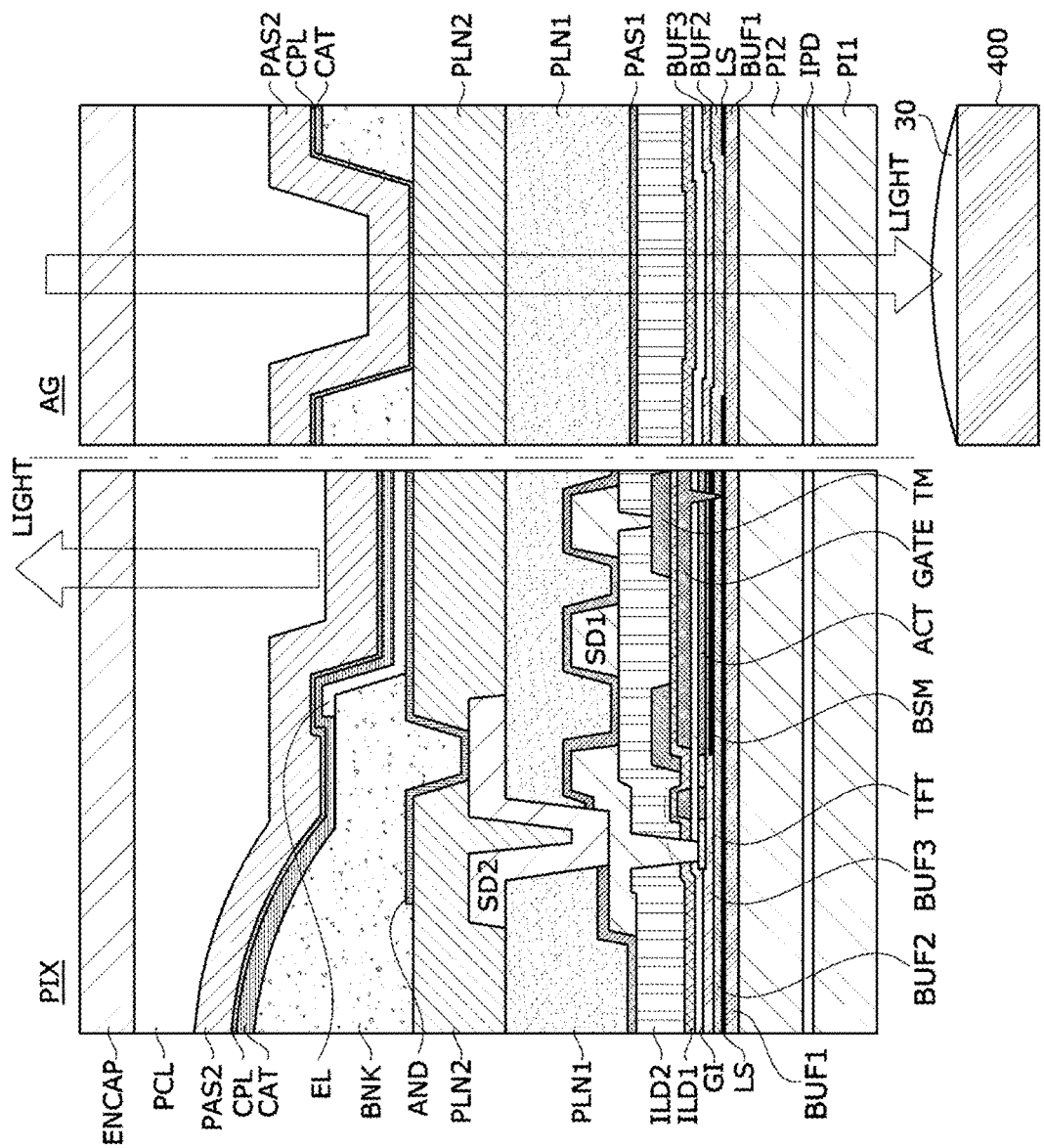

FIGS. 17 and 18 are cross-sectional views illustrating the light shield layer LS of the pixel region and the light transmitting part AG of the sensing region CA in the cross-sectional structure of the display panel according to various embodiments of the present disclosure. In FIGS. 17 and 18, components that are substantially the same as those shown in FIG. 16 are denoted by the same reference numerals, and detailed descriptions thereof will be omitted or may be briefly provided.

Referring to FIG. 17, the light shield layer LS protects pixel regions PIX of the display region DA and the sensing region CA from the laser beam LB irradiated to the display panel 100 in the laser ablation process.

The light shield layer LS is removed from the region of the light transmitting part AG to define an opening hole OP which exposes the light transmitting part AG to the laser beam. The laser beam LB generated in the laser ablation process removes a metal layer to be removed through the opening hole OP of the light shield layer LS, for example, a cathode metal in the light transmitting part region. Each of the display region DA and the pixel region (the second pixel region) of the sensing region CA includes a light shield layer, and a metal layer having a higher absorption coefficient than the light shield layer for a specific wavelength of a laser beam. The metal layer of the cathode CAT can include magnesium (Mg).

The light shield layer LS can be disposed under the TFT in the pixel region to prevent a photocurrent of the TFT. In this case, the light shield layer LS can be formed of metal having a lower absorption coefficient for the wavelength of the laser beam than the metal layer to be removed. When the metal layer to be removed is a cathode material formed of an Mg/Ag alloy, the light shield layer LS can be formed of Mo having an absorption coefficient lower than that of Mg for the laser beam LB having a wavelength of 1,064 nm. Mo is a metal having high light reflectance, and thus can prevent the photocurrent of the TFT by reflecting external light.

The light shield layer LS shown in FIG. 17 is disposed between the inorganic insulating layers BUF1 and BUF2 under the TFT in the pixel region PIX.

The light shield layer LS shown in FIG. 18 is an example formed of amorphous silicon (a-Si). Since the amorphous silicon has an absorption coefficient lower than that of Mg for the laser beam LB having the wavelength of 1,064 nm, upper metal layers can be protected from the laser beam for removing Mg and Ag in the laser ablation process. In this case, since the light shield layer LS may not block external light which affects the TFT of the pixel region PIX, a separate bottom shield metal pattern BSM can be added to the pixel region PIX. The bottom shield metal pattern BSM shown in FIG. 18 is disposed between the inorganic insulating layers BUF2 and BUF3 under the TFT in the pixel region PIX. In FIG. 18, the second buffer layer BUF2 is an inorganic insulating layer formed between the light shield layer LS and the bottom shield metal pattern BSM in the pixel region PIX. A third buffer layer BUF3 is an inorganic insulating layer formed between the light shield layer LS and the active layer ACT in the pixel region PIX.

All metal layers in the pixel region PIX are removed from the light transmitting part AG. Accordingly, only transparent insulating layers can be present in the light transmitting part AG.

Figure 19:
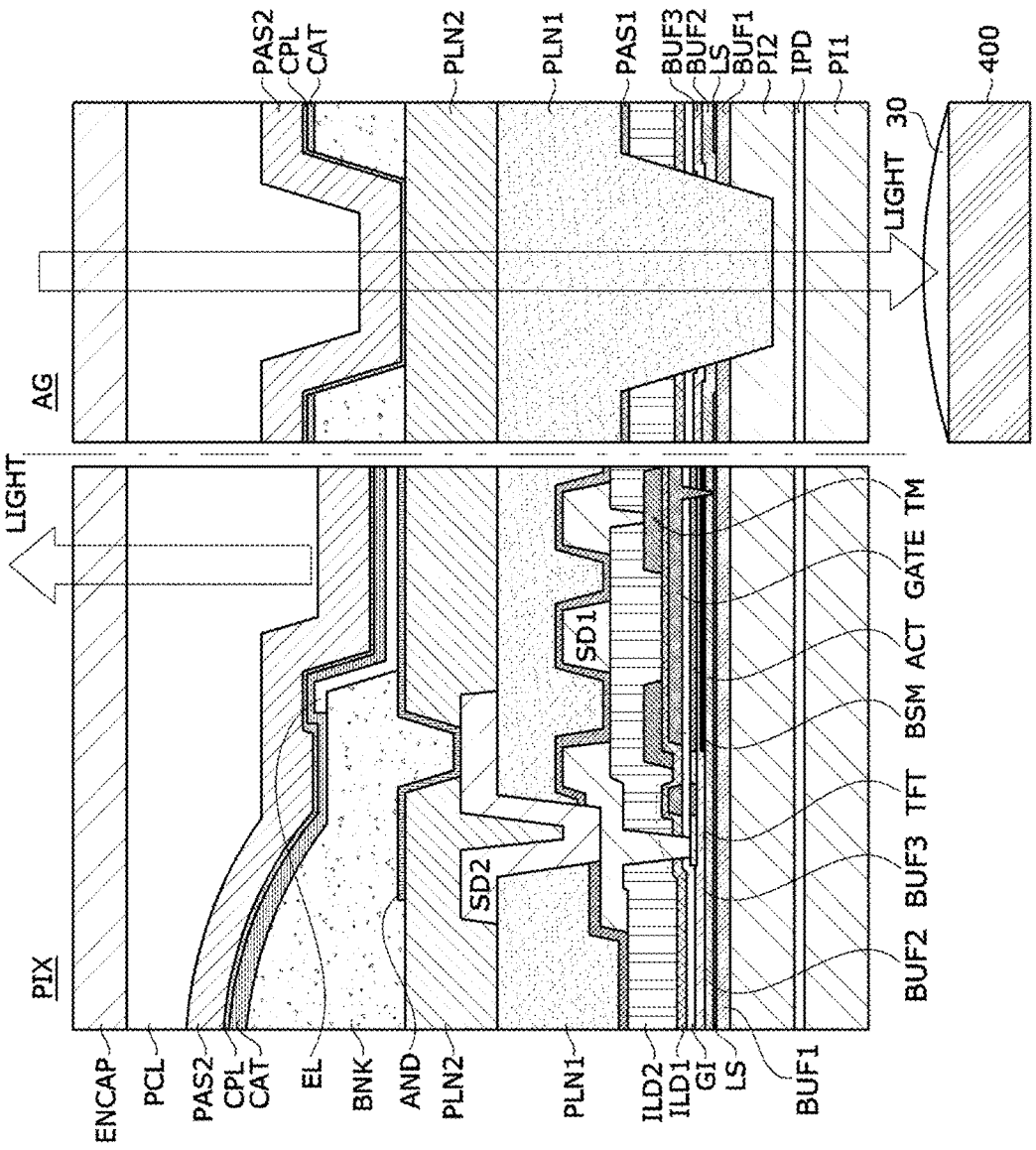
FIG. 19 is a cross-sectional view illustrating an example of an insulating layer which can be removed from the light transmitting part of the sensing region.

One of the PI substrates PI1 and PI2 can be removed from the light transmitting part AG as shown in FIG. 19. One or more of the inorganic insulating layers BUF1, BUF2, GI, ILD1, ILD2, and PAS1 can be removed from the light transmitting part AG, and one or more of the active layer ACT, the pixel definition film BNK, and the spacer SPC can be further removed. Due to the insulating layer(s) removed from the light transmitting part AG, a concave portion can be filled by the organic insulating layers PLN1 and PLN2.

Figure 20A:
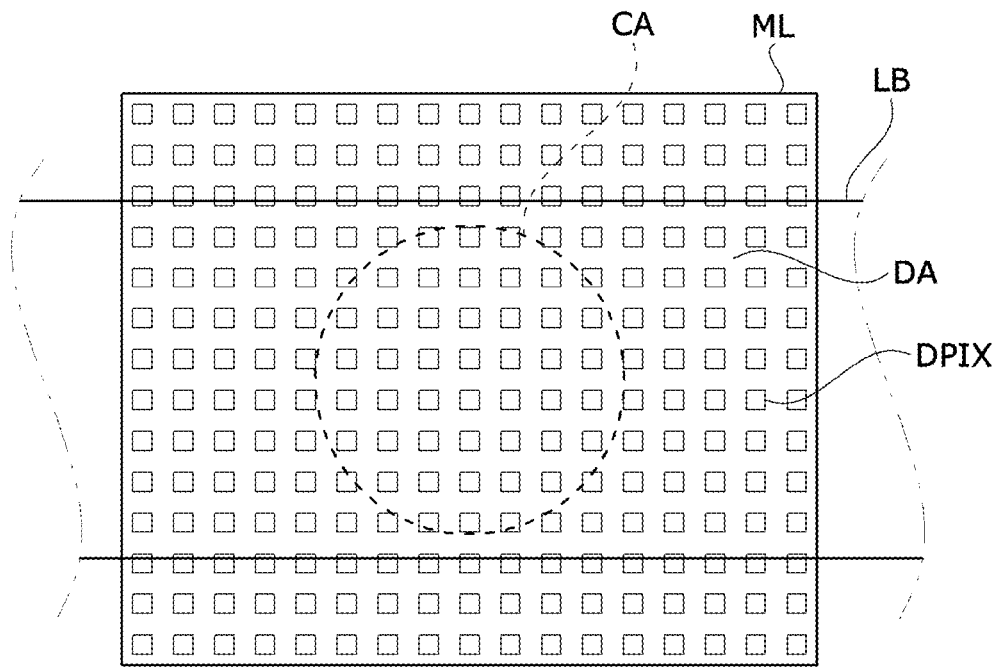
FIGS. 20A and 20B are views illustrating the metal layer of the display panel and the light shield layer overlapping the metal layer.
Figure 20A:
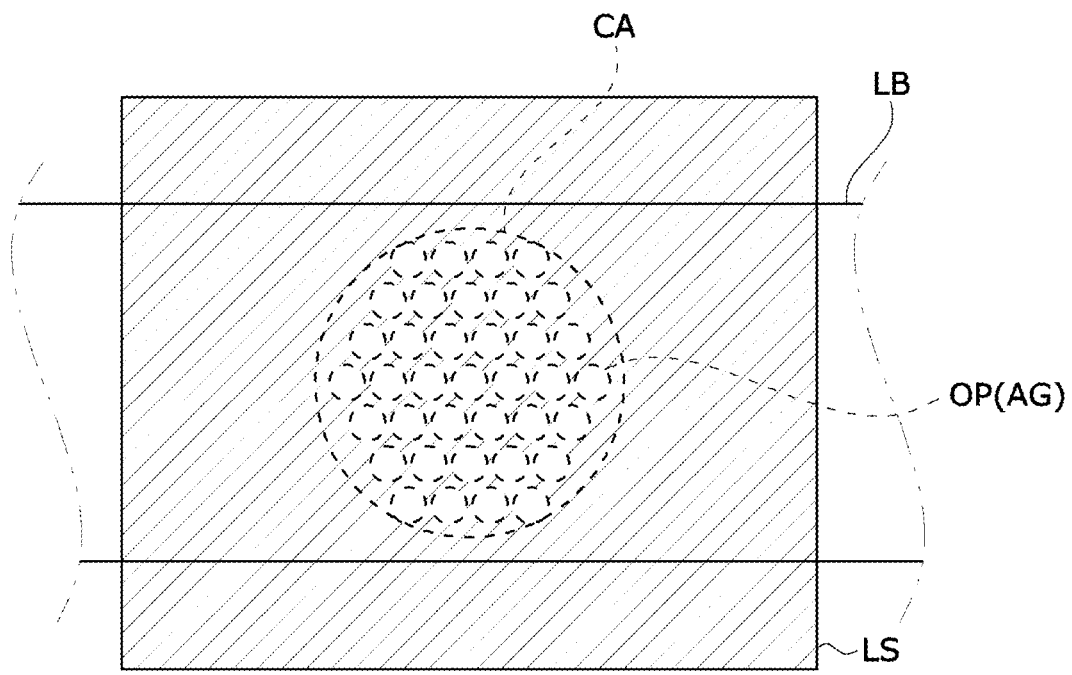
Figure 20B:
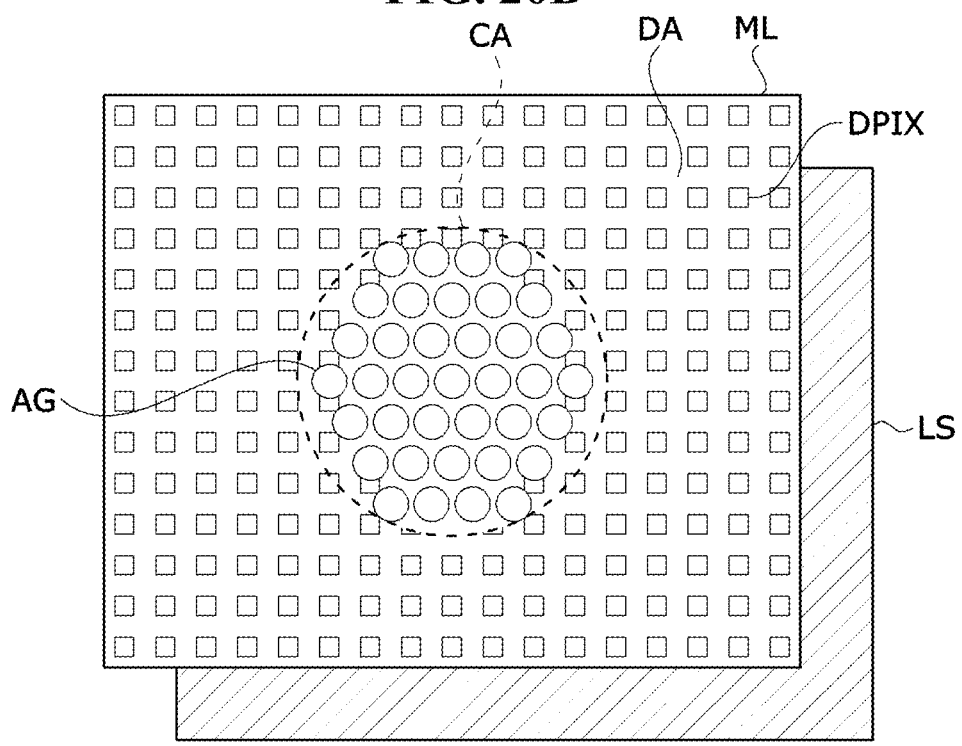

In the photolithography process of patterning the metal layers of the display panel, when a density difference between the metal patterns of the display region DA and the metal patterns of the sensing region CA is large, a difference in etch ratio can occur. The difference in etch ratio can cause size differences and the like of a gap and overlapping portion between the patterned metal patterns, and thus can cause a critical dimension (CD) defect. In the present disclosure, in order to minimize the density difference between the metal patterns of the display region DA and the metal patterns of the sensing region CA, a dummy pattern DPIX having the same pattern shape as the pixel region PIX can be formed on the metal layer ML of the light transmitting part AG as shown in FIG. 20A, and then at least a portion of the metal layer ML in the light transmitting part AG can be removed using the light shield layer LS in the laser ablation process as shown in FIG. 20B. The metal layer ML other than the opening hole OP of the light shield layer LS remains on the sensing region CA, and dummy patterns DP facing the opening hole OP of the light shield layer LS can be removed. Here, the metal layer ML can be one or more of the first to fifth metal layers of the circuit layer 12. The light shield layer LS can be selected from a material having a lower absorption coefficient than that of the metal layer at the wavelength of the laser beam which removes the metal layer.

In the above-described embodiments, a semiconductor layer ACT can be disposed over the light shield layer LS. The semiconductor layer ACT can be formed of amorphous silicon (a-Si). In order to increase the electron mobility of the semiconductor layer ACT, the amorphous silicon (a-Si) can be crystallized. To this end, the amorphous silicon (a-Si) of the semiconductor layer ACT can be crystallized in a laser crystallization (an excimer laser annealing (ELA)) process as shown in FIG. 21. The amorphous silicon (a-Si) is converted to polysilicon having a polycrystalline structure by the laser crystallization process. In the laser crystallization process, an interlayer separation or film-delamination phenomenon can occur between the light shield layer LS and another layer adjacent thereto.

For example, when the light shield layer LS is formed of the amorphous silicon (a-Si), hydrogen ($H_2$) atoms can be bonded to a dangling bond of the amorphous silicon (a-Si). In the laser crystallization process, an amorphous silicon film used as the semiconductor layer ACT is scanned by a laser beam (a line beam) having a wavelength of 308 nm at a high temperature higher than or equal to a melting temperature of the amorphous silicon (a-Si), for example, 1,400° C. or higher. In this case, since the hydrogen atoms penetrating into the amorphous silicon (a-Si) used as the light shield layer LS can explode at a temperature of approximately 450° C., the film-delamination phenomenon of the light shield layer LS can occur. To prevent this, the light shield layer LS can be sandwiched between materials having no hydrogen or a very low hydrogen content. In the example in FIG. 21, a second oxide film OX2 is disposed between the semiconductor layer ACT and the light shield layer LS. A first oxide film OX1 can be disposed between the light shield layer LS and the first buffer layer BUF1 under the light shield layer LS.

In FIG. 21, the light shield layer LS is formed between the first and second oxide films OX1 and OX2 without hydrogen atoms. In this structure, since the hydrogen atoms are not bonded to the amorphous silicon (a-Si) used as the light shield layer LS, it is possible to prevent the film-delamination phenomenon of the light shield layer LS in the laser crystallization process.

The first and second oxide films OX1 and OX2 are exemplified as silicon oxide films $SiO_2$ in FIG. 21, but are not limited thereto. For example, each of the oxide films OX1 and OX2 can be formed as a single layer film or a multilayer film selected from the silicon oxide film ($SiO_2$), a zirconium oxide film ($ZrO_2$), and a hafnium oxide film ($HfO_2$). The first and second oxide films OX1 and OX2 can be formed of oxide films of the same material and can have the same thickness. Further, the first and second oxide films OX1 and OX2 can be formed of oxide films of different materials or can be formed to have different thicknesses.

Figure 22A:
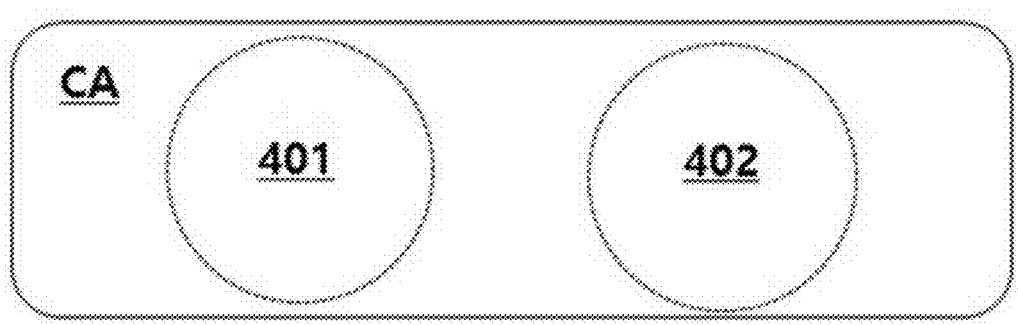
FIG. 22A is a view illustrating an example in which a plurality of sensor modules are disposed in the sensing region.

As shown in FIG. 22A, according to one example of the present disclosure, a plurality of sensor modules can be disposed in the sensing region CA. For example, an infrared sensor module can be further disposed together with the imaging element module 400 in the sensing region CA. Another sensor such as an illuminance sensor or a proximity sensor can be additionally disposed in the sensing region CA. Low PPI pixels and the light transmitting part AG can be disposed over light receiving surfaces 401 and 402 of the imaging element module 400 and the infrared sensor module, respectively. Since the transmittance of an infrared wavelength is higher than that of a visible light wavelength in the thin films in the sensing region CA, the number of and/or size of light transmitting parts AG can be small or the light transmitting parts AG may not be present in the light receiving surface 402 of the infrared sensor module compared to the light receiving surface 401 of the imaging element module. Meanwhile, the infrared sensor module can sense infrared rays and can be used for facial recognition.

The light shield layer LS can be formed of a plurality of different materials by dividing regions within the sensing region CA. For example, when the infrared sensor module as well as the imaging element module are disposed on the sensing region CA as shown in FIG. 22A, the transparency of the light shield layer LS in a region where the infrared sensor module is located can be higher than the transparency of the light shield layer LS in a region where the imaging element module 400 is located. The transparency of the light shield layer LS can vary according to any electronic module located on the region where the light shield layer LS is located. For example, amorphous silicon (a-Si) can be used as the light shield layer LS on the light receiving surface 402 of the infrared sensor module, and molybdenum (Mo) can be used as the light shield layer LS on the light receiving surface 401 of the imaging element module.

Figure 22B:
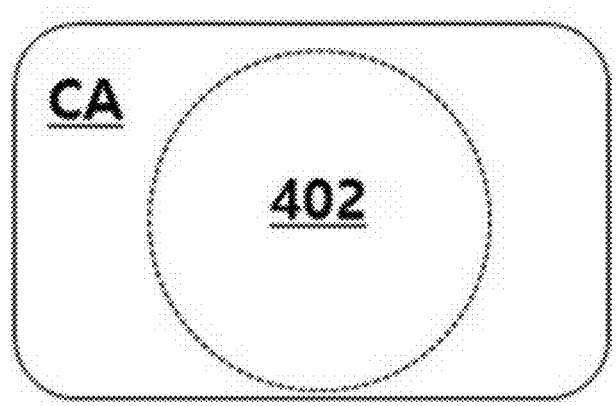
FIG. 22B is a view illustrating another example in which only one sensor module is disposed in the sensing region.

As a variation or an alternative to the example as shown in FIG. 22A, another example of the present disclosure is shown in FIG. 22B, in which only one sensor module (for example, a light sensor module other than an imaging element module) is disposed in the sensing region CA. As an example, the one sensor module comprises, but is not limited to, an infrared sensor module.

In the present disclosure, since a light shield layer having a low absorption coefficient for a specific laser wavelength is disposed in pixel regions other than a metal layer to be removed, light transmitting parts of an sensing region can be simultaneously removed by a large laser beam in a shape of a line beam or a block beam. Accordingly, in the present disclosure, the metal layer can be cleanly and quickly removed from the light transmitting parts without a residual metal, and fabrication costs of the display panel can be reduced by minimizing a laser ablation process time and a defect rate.

In the present disclosure, the transmittance of the sensing region can be increased by completely removing the metal layer from the light transmitting parts without the residual metal, and a margin between a display region and the sensing region can be minimized.

Further, in the present disclosure, since the metal layer is removed from the light transmitting parts without the residual metal, the transmittance of the sensing region can be increased, and the noise of imaged image data can be reduced.

Effects which can be achieved by the present disclosure are not limited to the above-mentioned effects. For example, other objects that are not mentioned can be obviously understood by those skilled in the art to which the present disclosure pertains from the following description.

While the embodiments of the present disclosure have been described in detail above with reference to the accompanying drawings, the present disclosure is not limited to the embodiments, and various changes and modifications can be made without departing from the technical spirit of the present disclosure. Accordingly, the embodiments disclosed herein are to be considered descriptive and not restrictive of the technical spirit of the present disclosure, and the scope of the technical spirit of the present disclosure is not limited by the embodiments. Therefore, it should be understood that the above embodiments are illustrative rather than restrictive in all respects. The scope of the disclosure should be construed by the appended claims, and all technical spirits within the scopes of their equivalents should be construed as being included in the scope of the disclosure.

What is claimed is:

1. A display panel comprising:
a display region including a first pixel region where a plurality of pixels are disposed;
a sensing region including a second pixel region where a plurality of pixel groups are disposed, and a light transmitting part disposed between the plurality of pixel groups;
a circuit layer disposed in the first and second pixel regions, the circuit layer including a plurality of transistors;
a metal layer disposed in the first pixel region of the display region and the second pixel region of the sensing region; and
a light shield layer disposed under the plurality of transistors and extending across the display region and the sensing region,
wherein the light shield layer in the sensing region includes a first hole corresponding to the light transmitting part, and
wherein the metal layer in the second pixel region of the sensing region includes a second hole that overlaps with the first hole in the light shield layer.

2. The display panel of claim 1, wherein:
the light shield layer includes a metal or inorganic film, and is removed from a light transmitting part region of the sensing region to expose the light transmitting part.

3. The display panel of claim 1, wherein the metal layer has a higher absorption coefficient than the light shield layer for a specific wavelength of a laser beam,
wherein the metal layer is removed from the light transmitting part by irradiating the laser beam to at least the sensing region.

4. The display panel of claim 1, wherein:
the light shield layer includes molybdenum (Mo) or amorphous silicon (a-Si).

5. The display panel of claim 1, wherein:
the first and second pixel regions include a light emitting element layer disposed on the circuit layer; and
the light shield layer is disposed in the circuit layer.

6. The display panel of claim 5, wherein:
the circuit layer includes a transistor connected to a light emitting element of the light emitting element layer; and
the light shield layer is disposed between inorganic insulating layers under the transistor.

7. The display panel of claim 6, wherein:
the light emitting element layer includes an organic light emitting diode in which an organic compound layer is sandwiched between a cathode and an anode; and
the light shield layer includes a material having a lower absorption coefficient than the cathode at a specific wavelength of the laser beam.

8. The display panel of claim 6, wherein:
each of the pixel regions of the display region and the sensing region further includes a light shield pattern disposed between the light shield layer and the transistor; and
the light shield pattern includes a metal.

9. The display panel of claim 1, further comprising:
a semiconductor layer disposed over the light shield layer;
a first oxide film disposed under the light shield layer; and
a second oxide film disposed between the semiconductor layer and the light shield layer.

10. The display panel of claim 9, wherein:
the light shield layer includes amorphous silicon; and
the first and second oxide films are formed of a single layer film or a multilayer film selected from a silicon oxide film ($SiO_2$), a zirconium oxide film ($ZrO_2$), and a hafnium oxide film ($HfO_2$).

11. The display panel of claim 1, wherein:
the number of pixels per unit area of the sensing region is lower than that of the display region.

12. The display panel of claim 1, wherein:
each pixel of each of the plurality of pixel groups includes two to four sub-pixels, a distance between the light transmitting parts in the sensing region is smaller than a pitch between the pixel groups, a pitch between the sub-pixels is smaller than the pitch between the pixel groups, and the distance between the light transmitting parts is smaller than the pitch between the sub-pixels.

13. The display panel of claim 1, wherein only one sensor module is disposed in the sensing region, or wherein a plurality of sensor modules are disposed in the sensing region, and the light shield layer is formed of a plurality of different materials by dividing regions within the sensing region.

14. The display panel of claim 13, wherein:

the plurality of sensor modules comprises an imaging element module and an infrared sensor module, the pixel groups and the light transmitting part are disposed over light receiving surfaces of the imaging element module and the infrared sensor module respectively, and at least one of the number and size of light transmitting parts is small or the light transmitting parts are not present in a light receiving surface of the infrared sensor module compared to a light receiving surface of the imaging element module.

15. The display panel of claim 14, wherein:

a transparency of the light shield layer in a region where the infrared sensor module is located is higher than a transparency of the light shield layer in a region where the imaging element module is located.

16. The display panel of claim 14, wherein:

amorphous silicon is used as the light shield layer on the light receiving surface of the infrared sensor module, and molybdenum is used as the light shield layer on the light receiving surface of the imaging element module.

17. The display panel of claim 5, further comprising:

a third hole in the light emitting element layer in the second pixel region of the sensing region, wherein the third hole overlaps with the first hole in the light shield layer and the second hole in the metal layer.

18. The display panel of claim 10, wherein an upper surface of the light shield layer directly contacts a lower surface of the second oxide film, and a lower surface of the light shield layer directly contacts an upper surface of the first oxide film.

19. A display device comprising:

a display region including a first plurality of pixels;

a sensing region including a second plurality of pixels, and a light transmitting part disposed between at least two pixels among the second plurality of pixels;

a cathode layer disposed in the display region and the sensing region; and a light shield layer disposed across the display region and the sensing region, wherein the light shield layer in the sensing region includes a first hole corresponding to the light transmitting part, and wherein the cathode layer in the second pixel region of the sensing region includes a second hole that overlaps with the first hole in the light shield layer.

20. The display device of claim 19, wherein the light shield layer in the display region is free of any holes.

21. A display panel comprising:

a display region including a first pixel region where a plurality of pixels are disposed; and a sensing region including a second pixel region where a plurality of pixel groups are disposed, and a light transmitting part disposed between the pixel groups, wherein at least the sensing region includes:

a light shield layer; and a metal layer disposed over the light shield layer, wherein the light shield layer includes an opening hole corresponding to the light transmitting part, and an edge of the metal layer is aligned with an edge of the opening hole in the sensing region.

* * * * *

UNITED STATES PATENT AND TRADEMARK OFFICE
CERTIFICATE OF CORRECTION

PATENT NO. : 11,758,776 B2
APPLICATION NO. : 17/364286
DATED : September 12, 2023
INVENTOR(S) : Duk Young Jeong et al.

It is certified that error appears in the above-identified patent and that said Letters Patent is hereby corrected as shown below:

On the Title Page

Item (72), Inventors, Change:
"Duk Young Jeong, Paju-si (KR); Chui Nam, Paju-si (KR); Byeong Seong So, Paju-si (KR)"
To:
--Duk Young Jeong, Paju-si (KR); Chul Nam, Paju-si (KR); Byeong Seong So, Paju-si (KR)--

Signed and Sealed this
Nineteenth Day of December, 2023

Katherine Kelly Vidal
*Director of the United States Patent and Trademark Office*